US007790352B2

(12) United States Patent
Oda

(10) Patent No.: US 7,790,352 B2
(45) Date of Patent: Sep. 7, 2010

(54) LITHOGRAPHIC PRINTING PLATE PRECURSOR

(75) Inventor: Akio Oda, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/073,429

(22) Filed: Mar. 5, 2008

(65) Prior Publication Data

US 2008/0227026 A1 Sep. 18, 2008

Related U.S. Application Data

(63) Continuation of application No. 11/316,833, filed on Dec. 27, 2005, now Pat. No. 7,435,532.

(30) Foreign Application Priority Data

Dec. 27, 2004 (JP) .......................... P.2004-377130

(51) Int. Cl.
*G03F 7/095* (2006.01)
*G03F 7/11* (2006.01)
*B41N 1/08* (2006.01)

(52) U.S. Cl. .............. 430/276.1; 430/281.1; 101/463.1; 101/450.1

(58) Field of Classification Search .............. 430/270.1, 430/300, 302, 286.1, 287.1, 288.1; 101/453, 101/454, 463.1
See application file for complete search history.

(56) References Cited

U.S. PATENT DOCUMENTS

| | | | | |
|---|---|---|---|---|
| 4,275,142 | A * | 6/1981 | Hosaka et al. | 430/271.1 |
| 4,578,342 | A * | 3/1986 | Sekiya | 430/159 |
| 5,393,637 | A | 2/1995 | Kanda et al. | |
| 5,569,573 | A | 10/1996 | Takahashi et al. | |
| 6,576,401 | B2 | 6/2003 | Teng | |
| 6,593,055 | B2 * | 7/2003 | Shimazu et al. | 430/166 |
| 2003/0113666 | A1 | 6/2003 | Endo | |
| 2003/0215750 | A1 | 11/2003 | Inno | |
| 2004/0229165 | A1 | 11/2004 | Munnelly et al. | |
| 2005/0064337 | A1 | 3/2005 | Suganuma et al. | |
| 2005/0074692 | A1 * | 4/2005 | Makino et al. | 430/270.1 |
| 2006/0046199 | A1 | 3/2006 | Mitsumoto et al. | |
| 2006/0075915 | A1 | 4/2006 | Sonokawa et al. | |

FOREIGN PATENT DOCUMENTS

| | | | |
|---|---|---|---|
| EP | 1 038 667 | A2 | 9/2000 |
| EP | 1203660 | A1 | 5/2002 |
| EP | 1442877 | A2 | 8/2004 |
| EP | 1 470 914 | A2 | 10/2004 |
| EP | 1552923 | A2 | 7/2005 |
| JP | 7-1849 | A | 1/1995 |
| JP | 2938397 | B2 | 6/1999 |
| JP | 2000-338654 | A | 12/2000 |
| JP | 2001-277740 | A | 10/2001 |
| JP | 2001-277741 | A | 10/2001 |
| JP | 2001-277742 | A | 10/2001 |
| JP | 2002-211262 | A | 7/2002 |
| JP | 2002-287334 | A | 10/2002 |
| JP | 2004-341500 | A | 12/2004 |
| WO | 03/087939 | A2 | 10/2003 |

OTHER PUBLICATIONS

Japanese Office Action, Application No. 2004-377130, Jun. 1, 2010, pp. 1-2 (w/full English translation).

* cited by examiner

*Primary Examiner*—Cynthia H Kelly
*Assistant Examiner*—Anca Eoff
(74) *Attorney, Agent, or Firm*—Birch, Stewart, Kolasch & Birch, LLP

(57) ABSTRACT

A lithographic printing plate precursor having a good press life with a practical energy amount, which can be on-press developed without passing through a development processing step after recording an image by a laser of emitting an infrared ray, is provided, which is a lithographic printing plate precursor capable of performing a development and printing by loading on a printing press after imagewise exposure and supplying an oily ink and an aqueous component, the lithographic printing plate precursor comprising a support and an image recording layer, wherein the image recording layer comprises (A) a polymerization initiator, (B) a polymerizable monomer, (C) a binder polymer, and (D) a crosslinked resin particle having a reactive group or (F) a microcapsule containing a polymerizable monomer in the capsule wall, and the image recording layer is imagewise polymerization-curable upon irradiation of actinic ray.

7 Claims, No Drawings

LITHOGRAPHIC PRINTING PLATE PRECURSOR

This application is a Continuation of application Ser. No. 11/316,833 filed on Dec. 27, 2005, now U.S. Pat. No. 7,435,532 and for which priority is claimed under 35 U.S.C. §120, which claims priority of Application No. P2004-377130 filed in Japan on Dec. 27, 2004 under 35 U.S.C. §119, the entire contents of all are hereby incorporated by reference.

BACKGROUND OF THE INVENTION

1. Field of the Invention

The present invention relates to an on-press development-type lithographic printing plate precursor on which an image can be recorded by scanning an infrared laser ray based on digital signals of a computer or the like.

2. Background Art

The lithographic printing plate in general consists of a lipophilic image area of receiving an ink in the printing process and a hydrophilic non-image area of receiving a fountain solution. The lithographic printing is a printing method utilizing the repellency between water and an oily ink from each other, where the lipophilic image area of the lithographic printing plate and the hydrophilic non-image area are formed as an ink-receiving part and a fountain solution-receiving part (ink non-receiving part), respectively, to cause difference in the ink adhesion on the surface of the lithographic printing plate, an ink is attached only to the image area and thereafter, the ink is transferred to a material on which the image is printed, such as paper, thereby performing printing.

For producing this lithographic printing plate, a lithographic printing plate precursor (PS plate) comprising a hydrophilic support having provided thereon a lipophilic photosensitive resin layer (image recording layer) has been heretofore widely used. Usually, a lithographic printing plate is obtained by a plate-making method where the lithographic printing plate precursor is exposed through an original image such as lith film and while leaving the image recording layer in the portion working out to the image area, the other unnecessary image recording layer is dissolved and removed with an alkaline developer or an organic solvent to reveal the hydrophilic support surface, thereby forming a non-image area.

In the plate-making process using a conventional lithographic printing plate precursor, a step of dissolving and removing the unnecessary image recording layer with a developer or the like must be provided after exposure but as one problem to be solved, it is demanded to dispense with or simplify such an additive wet processing. In particular, the treatment of a waste solution discharged accompanying the wet processing is recently a great concern to the entire industry in view of consideration for global environment and the demand for solving the above-described problem is becoming stronger.

As one of simple plate-making methods to cope with such a requirement, a method called on-press development has been proposed, where an image recording layer allowing for removal of the unnecessary portion of the image recording layer in a normal printing process is used and after exposure, the unnecessary portion of the image recording layer is removed on a printing press to obtain a lithographic printing plate.

Specific examples of the on-press development method include a method using a lithographic printing plate precursor having an image recording layer dissolvable or dispersible in a fountain solution, an ink solvent or an emulsified product of fountain solution and ink, a method of mechanically removing the image recording layer by the contact with rollers or a blanket cylinder of a printing press, and a method of weakening the cohesion of the image recording layer or adhesion between the image recording layer and the support by the impregnation of a fountain solution, an ink solvent or the like and then mechanically removing the image recording layer by the contact with rollers or a blanket cylinder.

In the present invention, unless otherwise indicated, the "development processing step" indicates a step where, by using an apparatus (usually an automatic developing machine) except for a printing press, the image recording layer in the portion unexposed with an infrared laser of a printing plate precursor is removed through contact with a liquid (usually an alkaline developer) to reveal the hydrophilic support surface, and the "on-press development" indicates a method or step where, by using a printing press, the image recording layer in the portion unexposed with an infrared laser is removed through contact with a liquid (usually a printing ink and/or a fountain solution) to reveal the hydrophilic support surface.

However, when an image recording layer for conventional image recording systems utilizing ultraviolet ray or visible light is used, the image recording layer is not fixed after exposure and therefore, for example, a cumbersome method of storing the exposed lithographic printing plate precursor in a completely light-shielded state or under constant temperature conditions until loading on a printing press must be taken.

On the other hand, a digitization technique of electronically processing, storing and outputting image information by using a computer has been recently widespread and various new image-output systems coping with such a digitization technique have been put into practical use. Along with this, a computer-to-plate technique is attracting attention, where digitized image information is carried on a highly converging radiant ray such as laser light and a lithographic printing plate precursor is scan-exposed by this light to directly produce a lithographic printing plate without intervention of a lith film. Accordingly, one of important technical problems to be solved is to obtain a lithographic printing plate precursor suitable for such a technique.

As described above, the demand for a simplified, dry-system or non-processing plate-making work is ever-stronger in recent years from both aspects of consideration for global environment and adaptation for digitization.

In recent years, a high output laser such as semiconductor laser and YAG laser is inexpensively available and a method using such a high output laser for the image recording means is promising as a method for producing a lithographic printing plate by scanning exposure which is readily incorporated in the digitization technique.

In a conventional plate-making method, imagewise exposure of low intensity to medium intensity is applied to a photosensitive lithographic printing plate precursor, and the image recording is effected by utilizing an imagewise change in the physical properties resulting from a photochemical reaction in the image recording layer. On the other hand, in the method using a high output laser, a large quantity of light energy is irradiated on the exposure region for a very short time to efficiently convert the light energy to heat energy and by the effect of this heat, a chemical change, a phase change or a thermal change such as change of morphology or structure is caused and utilized for the image recording. Accordingly, image information is input by light energy such as laser light, but image recording is performed by a reaction due to heat energy in addition to light energy. The recording system making use of heat generation by such high power density exposure is usually called heat-mode recording and the conversion from light energy to heat energy is called light-to-heat conversion.

A great advantage of the plate-making method using heat-mode recording is that the image recording layer is not sensitized by light of normal intensity level such as room lighting, and fixing of the image recorded by high intensity exposure is not indispensable. That is, the lithographic printing plate precursor used for heat-mode recording is free from fear of being sensitized by room light before exposure and not required to fix the image after exposure. Accordingly, for example, when an image recording layer which is insolubilized or solubilized by exposure with a high output laser is used and a plate-making process of imagewise processing the exposed image recording layer to produce a lithographic printing plate is performed by on-press development, a system where even if the printing plate precursor is exposed to environmental light in a room after exposure, this does not affect the image, can be established. In this way, it is expected that when heat-mode recording is utilized, a lithographic printing plate precursor suitable for on-press development can be obtained.

A laser is recently making a remarkable progress and particularly, as for the semiconductor laser and solid laser of emitting an infrared ray at a wavelength of 760 to 1,200 nm, a high-output and compact laser becomes easily available. Such an infrared laser is very useful as a recording light source at the direct production of a printing plate from digital data of a computer or the like.

However, many photosensitive recording materials useful in practice as the image recording layer have sensitivity in the visible light region at a wavelength of 760 nm or less and therefore, image recording cannot be performed by an infrared laser. A material allowing for image recording by an infrared laser is demanded.

In this connection, for example, Patent Document 1: Japanese Patent No. 2,938,397 describes a lithographic printing plate precursor where an image-forming layer comprising a hydrophilic binder having dispersed therein hydrophobic thermoplastic polymer particles is provided on a hydrophilic support. In Patent Document 1, it is stated that after exposing this lithographic printing plate precursor by an infrared laser to cause coalescence of hydrophobic thermoplastic polymer particles by the effect of heat and thereby form an image, the lithographic printing plate precursor can be loaded on a cylinder of a printing press and on-press developed with a fountain solution and/or an ink.

Such a method of forming an image through coalescence by mere heat fusion of fine particles has a problem that despite good on-press developability, the image strength (adhesion to the support) is extremely low and the press life is not satisfied.

Patent Documents 2 and 3: JP-A-2001-277740 (the term "JP-A" as used herein means an "unexamined published Japanese patent application") and JP-A-2001-277742 describe a lithographic printing plate precursor comprising a hydrophilic support having thereon a layer containing a polymerizable compound-enclosing microcapsule.

Also, Patent Document 4: JP-A-2002-287334 describes a lithographic printing plate precursor comprising a support having provided thereon a photosensitive layer containing an infrared absorbent, a radical polymerization initiator and a polymerizable compound.

The method using a polymerization reaction is characterized in that as compared with the image area formed by heat fusion of polymer fine particles, the image strength is relatively good by virtue of high chemical bonding density in the image area. However, in the practical viewpoint, the on-press developability, the press life and the polymerization efficiency (sensitivity) all are not yet satisfied and such a method is not used in practice.

SUMMARY OF THE INVENTION

Accordingly, an object of the present invention is to provide a lithographic printing plate precursor having a good press life with a practical energy amount, which can be on-press developed without passing through a development processing step after recording an image by a laser of emitting an infrared ray.

The present inventors have made intensive studies by taking notice of constituent components of an image recording material used for the image recording layer of a lithographic printing plate precursor, as a result, the above-described object can be attained by incorporating, in addition to (A) a polymerization initiator, (B) a polymerizable monomer and (C) a binder polymer, (D) a crosslinked resin particle having a reactive group, or (E) an infrared absorbent and (F) a microcapsule having a polymerizable monomer-containing capsule wall, into the image recording layer.

That is, the present invention is as follows.

1. A lithographic printing plate precursor capable of performing a development and printing by loading on a printing press after imagewise exposure and supplying an oily ink and an aqueous component, the lithographic printing plate precursor comprising a support and an image recording layer, wherein the image recording layer comprises (A) a polymerization initiator, (B) a polymerizable monomer, (C) a binder polymer and (D) a crosslinked resin particle having a reactive group, and the image recording layer is imagewise polymerization-curable upon irradiation of actinic ray.

2. The lithographic printing plate precursor as described in the item 1, wherein said image recording layer comprises (E) an infrared absorbent and is polymerization-curable upon irradiation of an infrared laser.

3. The lithographic printing plate precursor as described in the item 1 or 2, wherein the reactive group of said crosslinked resin particle (D) is at least one group selected from an ethylenically unsaturated group, an epoxy group, a hydroxyl group and an amino group.

4. The lithographic printing plate precursor as described in any one of the items 1 to 3, wherein said binder polymer (C) has an ethyleneoxy group.

5. A lithographic printing plate precursor capable of performing a development and printing by loading on a printing press after imagewise exposure and supplying an oily ink and an aqueous component, the lithographic printing plate precursor comprising a support and an image recording layer, wherein the image recording layer comprises (A) a polymerization initiator, (B) a polymerizable monomer, (C) a binder polymer, (E) an infrared absorbent and (F) a microcapsule having a polymerizable monomer-containing wall, and the image recording layer is imagewise polymerization-curable upon irradiation of actinic ray.

6. A lithographic printing method comprising:

imagewise exposing the lithographic printing plate precursor as described in any one of the items 1 to 5 by irradiation of actinic ray, wherein the image recording layer is imagewise polymerization-cured upon the irradiation of actinic ray; and performing a development and printing by loading the exposed lithographic printing plate precursor on a printing press and supplying an oily ink and an aqueous component.

According to the present invention, a lithographic printing plate precursor having a good press life with a practical energy amount can be provided, which can be on-press developed without passing through a development processing step after recording an image by a laser of emitting an infrared ray.

DETAILED DESCRIPTION OF THE INVENTION

Image Recording Layer

The lithographic printing plate precursor of the present invention comprises a support having thereon an image recording layer comprising (A) a polymerization initiator, (B) a polymerizable monomer, (C) a binder polymer and (D) a crosslinked resin particle having a reactive group, the image recording layer being imagewise polymerization-curable upon irradiation of actinic rays. In another embodiment of the present invention, the image recording layer comprises (A) a polymerization initiator, (B) a polymerizable monomer, (C) a binder polymer, (E) an infrared absorbent and (F) a microcapsule having a polymerizable monomer-containing wall.

In the lithographic printing plate precursor of the present invention, the image recording layer in the exposed part is cured upon irradiation of actinic rays to form a hydrophobic (lipophilic) region and at the initiation of printing, the unexposed part is swiftly removed from the support by a fountain solution, an ink or an emulsified product of fountain solution and ink. That is, the image recording layer is an image recording layer removable with a printing ink and/or a fountain solution.

In the present invention, it is preferred that the image recording layer contains (E) an infrared absorbent and the image recording layer in the exposed part can be polymerization-cured by the effect of actinic rays emitted from an infrared laser.

Each constituent component of the image recording layer is described below.

<(E) Infrared Absorbent>

In the case of forming an image on the lithographic printing plate precursor of the present invention by using a laser of emitting an infrared ray at 760 to 1,200 nm as the light source, use of an infrared absorbent is usually indispensable. The infrared absorbent has a function of converting the absorbed infrared ray into heat. By the effect of heat generated here, the polymerization initiator (radical generator) described later is thermally decomposed to generate a radical. The infrared absorbent used in the present invention is a dye or pigment having an absorption maximum at a wavelength of 760 to 1,200 nm.

As for the dye, commercially available dyes and known dyes described in publications such as *Senryo Binran* (*Handbook of Dyes*) (compiled by The Synthetic Organic Chemistry, Japan (1970)) may be used. Specific examples thereof include a dye such as azo dye, metal complex salt azo dye, pyrazolone azo dye, naphthoquinone dye, anthraquinone dye, phthalocyanine dye, carbonium dye, quinoneimine dye, methine dye, cyanine dye, squarylium dye, pyrylium salt and metal thiolate complex.

Preferred examples of the dye include cyanine dyes described in JP-A-58-125246, JP-A-59-84356 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875.

Also, near infrared absorbing sensitizers described in U.S. Pat. No. 5,156,938 may be suitably used. Furthermore, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium-based compounds described in JP-A-58-181051, JP-A-58-220143, JP-A-59-41363, JP-A-59-84248, JP-59-84249, JP-A-59-146063 and JP-A-59-146061, cyanine dyes described in JP-A-59-216146, pentamethinethiapyrylium salts described in U.S. Pat. No. 4,283,475, and pyrylium compounds described in JP-B-5-13514 (the term "JP-B" as used herein means an "examined Japanese patent publication") and JP-B-5-19702 may also be preferably used. Other preferred examples of the dye include near infrared absorbing dyes represented by formulae (I) and (II) of U.S. Pat. No. 4,756,993.

Also, other preferred examples of the infrared absorbing dye for use in the present invention include specific indolenine cyanine dyes described in JP-A-2002-278057, which are shown below.

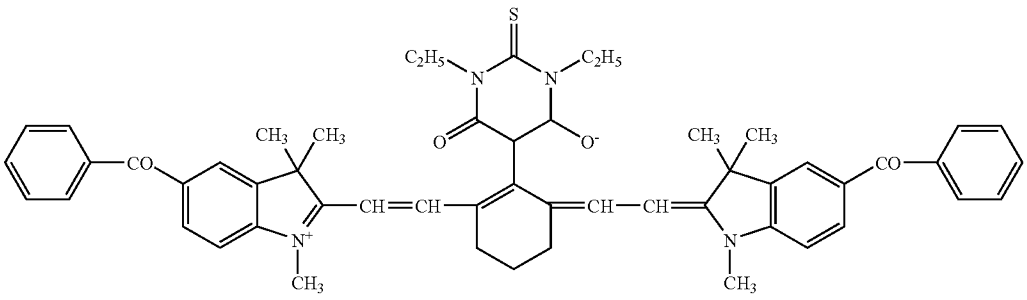

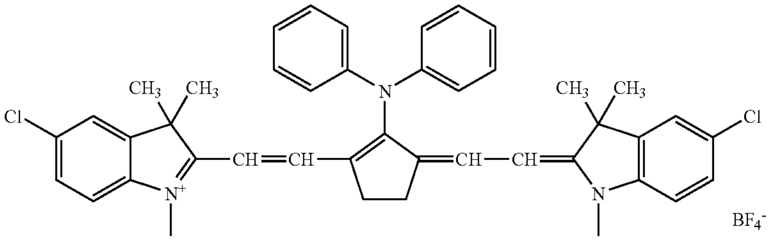

-continued

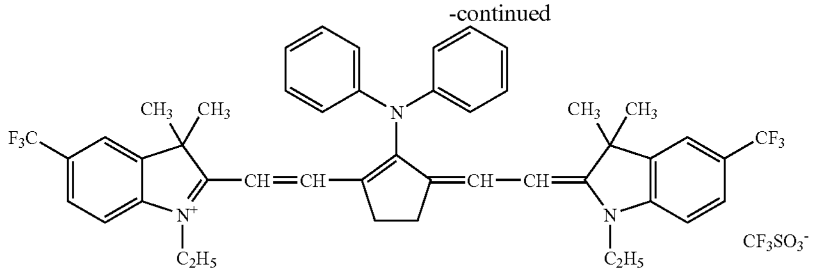

Among these dyes, preferred are a cyanine dye, a squarylium dye, a pyrylium salt, a nickel thiolate complex and an indolenine cyanine dye, more preferred are a cyanine dye and an indolenine cyanine dye, still more preferred is a cyanine dye represented by the following formula (I):

Formula (I):

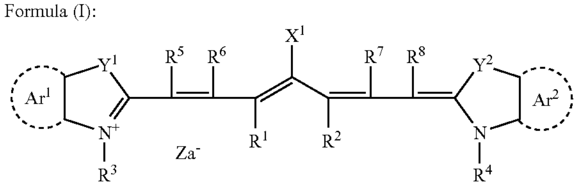

In formula (I), $X^1$ represents a hydrogen atom, a halogen atom, —$NPh_2$, $X^2$-$L^1$ or a group shown below, wherein $X^2$ represents an oxygen atom, a nitrogen atom or a sulfur atom, and $L^1$ represents a hydrocarbon group having from 1 to 12 carbon atoms, an aromatic ring having a heteroatom, or a hydrocarbon group having from 1 to 12 carbon atoms and containing a heteroatom. Incidentally, the heteroatom here represents N, S, O, a halogen atom or Se.

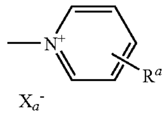

$X_a^-$ has the same definition as $Za^-$ described later, and $R^a$ represents a substituent selected from a hydrogen atom, an alkyl group, an aryl group, a substituted or unsubstituted amino group and a halogen atom.

$R^1$ and $R^2$ each independently represents a hydrocarbon group having from 1 to 12 carbon atoms. In view of storage stability of the coating solution for the recording layer, $R^1$ and $R^2$ each is preferably a hydrocarbon group having 2 to more carbon atoms, and $R^1$ and $R^2$ are more preferably combined with each other to form a 5- or 6-membered ring.

$Ar^1$ and $Ar^2$ may be the same or different and each represents an aromatic hydrocarbon group which may have a substituent. Preferred examples of the aromatic hydrocarbon group include a benzene ring and a naphthalene ring. Preferred examples of the substituent include a hydrocarbon group having 12 or less carbon atoms, a halogen atom and an alkoxy group having 12 or less carbon atoms. $Y^1$ and $Y^2$ may be the same or different and each represents a sulfur atom or a dialkylmethylene group having 12 or less carbon atoms. $R^3$ and $R^4$ may be the same or different and each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$ may be the same or different and each represents a hydrogen atom or a hydrocarbon group having 12 or less carbon atoms and in view of availability of the raw material, preferably a hydrogen atom. $Za^-$ represents a counter anion, but when the cyanine dye represented by formula (I) has an anionic substituent in its structure and neutralization of electric charge is not necessary, $Za^-$ is not present. In view of storage stability of the coating solution for the recording layer, $Za^-$ is preferably halogen ion, perchlorate ion, tetrafluoroborate ion, hexafluorophosphate ion or sulfonate ion, more preferably perchlorate ion, hexafluorophosphate ion or arylsulfonate ion.

Specific examples of the cyanine dye represented by formula (I), which can be suitably used in the present invention, include those described in paragraphs [0017] to [0019] of JP-A-2001-133969.

Other particularly preferred examples include specific indolenine cyanine dyes described in JP-A-2002-278057 supra.

As for the pigment used in the present invention, commercially available pigments and pigments described in *Color Index (C.I.) Binran (C.I. Handbook)*, *Saishin Ganryo Binran (Handbook of Latest Pigments)*, compiled by Nippon Ganryo Gijutsu Kyokai (1977), *Saishin Ganryo Oyo Gijutsu (Latest Pigment Application Technology)*, CMC Shuppan (1986), and *Insatsu Ink Gijutsu (Printing Ink Technology)*, CMC Shuppan (1984) can be used.

The kind of the pigment includes black pigment, yellow pigment, orange pigment, brown pigment, red pigment, violet pigment, blue pigment, green pigment, fluorescent pigment, metal powder pigment and polymer bond coloring matter. Specific examples of the pigment which can be used include an insoluble azo pigment, an azo lake pigment, a condensed azo pigment, a chelate azo pigment, a phthalocyanine-based pigment, an anthraquinone-based pigment, a perylene or perynone-based pigment, a thioindigo-based pigment, a quinacridone-based pigment, a dioxazine-based pigment, an isoindolinone-based pigment, a quinophthalone-based pigment, a dyed lake pigment, an azine pigment, a nitroso pigment, a nitro pigments, a natural pigment, a fluorescent pigment, an inorganic pigment and carbon black. Among these pigments, carbon black is preferred.

These pigments may or may not be surface-treated before use. Examples of the method for surface treatment include a method of coating the surface with resin or wax, a method of attaching a surfactant, and a method of bonding a reactive substance (for example, a silane coupling agent, an epoxy compound or an isocyanate) to the pigment surface. These surface-treating methods are described in *Kinzoku Sekken no Seishitsu to Oyo (Properties and Application of Metal Soap)*, Saiwai Shobo, *Insatsu Ink Gijutsu (Printing Ink Technology)*, CMC Shuppan (1984), and *Saishin Ganryo Oyo Gijutsu (Latest Pigment Application Technology)*, CMC Shuppan (1986).

The particle diameter of the pigment is preferably from 0.01 to 10 μm, more preferably from 0.05 to 1 μm, still more preferably from 0.1 to 1 μm. Within this range, good stability of the pigment dispersion in the coating solution for the image recording layer and good uniformity of the image recording layer can be obtained.

As for the method of dispersing the pigment, a known dispersion technique employed in the production of ink or toner may be used. Examples of the dispersing machine include an ultrasonic disperser, a sand mill, an attritor, a pearl mill, a super-mill, a ball mill, an impeller, a disperser, a KD mill, a colloid mill, a dynatron, a three-roll mill and a pressure kneader. These are described in detail in *Saishin Ganryo Oyo Gijutsu* (*Latest Pigment Application Technology*), CMC Shuppan (1986).

The infrared absorbent may be added together with other components in the same layer or may be added to a layer provided separately, but the infrared absorbent is added such that when a negative lithographic printing plate precursor is produced, the absorbancy of the image recording layer at a maximum absorption wavelength in the wavelength range of 760 to 1,200 nm becomes from 0.3 to 1.2, more preferably from 0.4 to 1.1, as measured by a reflection measuring method. Within this range, a uniform polymerization reaction proceeds in the depth direction of the image recording layer, and the image area can have good film strength and good adhesion to the support.

The absorbancy of the image recording layer can be adjusted by the amount of the infrared absorbent added to the image recording layer and the thickness of the image recording layer. The absorbancy can be measured by an ordinary method. Examples of the measuring method include a method where an image recording layer having a thickness appropriately decided within the range of the dry coated amount necessary as a lithographic printing plate is formed on a reflective support such as aluminum and the reflection density is measured by an optical densitometer, and a method of measuring the absorbancy by a spectrophotometer according to a reflection method using an integrating sphere.

<(A) Polymerization Initiator>

The polymerization initiator for use in the present invention is a compound of generating a radical by the effect of light or heat energy or both energies and thereby initiating or accelerating the polymerization of a polymerizable monomer having a polymerizable unsaturated group. Examples of the polymerization initiator usable in the present invention include known thermal polymerization initiators, a compound having a bond with a small bond-dissociation energy, and a photopolymerization initiator. In particular, the polymerization initiator suitably used in the present invention is a compound of generating a radical by the effect of heat energy and initiating or accelerating the polymerization of a compound having a polymerizable unsaturated group.

The polymerization initiator for use in the present invention is described in detail below, but these polymerization initiators may be used individually or in combination of two or more thereof.

Examples of such a polymerization initiator include an organohalogen compound, a carbonyl compound, an organic peroxide, an azo-based polymerization initiator, an azide compound, a metallocene compound, a hexaarylbiimidazole compound, an organoboron compound, a disulfone compound, an oxime ester compound and an onium salt compound.

Specific examples of the organohalogen compound include the compounds described in Wakabayashi et al., *Bull. Chem. Soc. Japan,* 42, 2924 (1969), U.S. Pat. No. 3,905,815, JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339, and M. P. Hutt, *Journal of Heterocyclic Chemistry,* 1, No. 3 (1970). In particular, an oxazole compound substituted with a trihalomethyl group, and an S-triazine compound are preferred.

Furthermore, an s-triazine derivative where at least one mono-, di- or tri-halogenated methyl group is bonded to the s-triazine ring is more preferred. Specific examples thereof include 2,4,6-tris(monochloromethyl)-s-triazine, 2,4,6-tris(dichloromethyl)-s-triazine, 2,4,6-tris-(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine and 2-methoxy-4,6-bis(tribromomethyl)-s-triazine.

Examples of the carbonyl compound include benzophenone; a benzophenone derivative such as Michler's ketone, 2-methylbenzophenone, 3-methylbenzophenone, 4-methylbenzo-phenone, 2-chlorobenzophenone, 4-bromobenzophenone and 2-carboxybenzophenone; an acetophenone derivative such as 2,2-dimethoxy-2-phenylacetophenone, 2,2-diethoxyaceto-phenone, 1-hydroxycyclohexyl phenyl ketone, α-hydroxy-2-methylphenylpropanone, 1-hydroxy-1-methylethyl-(p-isopropylphenyl) ketone, 1-hydroxy-1-(p-dodecylphenyl) ketone, 2-methyl-(4'-(methylthio)phenyl)-2-morpholino-1-propanone and 1,1,1-trichloromethyl-(p-butylphenyl) ketone; thioxanthone; a thioxanthone derivative such as 2-ethylthioxanthone, 2-isopropylthioxanthone, 2-chlorothioxanthone, 2,4-dimethylthioxanthone, 2,4-diethyl-thioxanthone and 2,4-diisopropylthioxanthone; and a benzoic acid ester derivative such as ethyl p-dimethylaminobenzoate and ethyl p-diethylaminobenzoate.

Examples of the azo-based compound which can be used include azo compounds described in JP-A-8-108621.

Examples of the organic peroxide include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxylaurate, tert-carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropyl-cumylperoxycarbonyl)benzophenone, carbonyl di(tert-butylperoxydihydrogendiphthalate) and carbonyl di(tert-hexylperoxydihydrogendiphthalate).

Examples of the metallocene compound include various titanocene compounds described in JP-A-59-152396, JP-A-61-151197, JP-A-63-41484, JP-A-2-249, JP-A-2-4705 and JP-A-5-83588, such as dicyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl and dimethylcyclopentadienyl-Ti-bis-2,3,4,5,6-pentafluorophen-1-yl, and iron-arene complexes described in JP-A-1-304453 and JP-A-1-152109.

Examples of the hexaarylbiimidazole compound include various compounds described in JP-B-6-29285 and U.S. Pat. Nos. 3,479,185, 4,311,783 and 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

Examples of the organoboron compound include organoborates described in JP-A-62-143044, JP-A-62-150242, JP-A-9-188685, JP-A-9-188686, JP-A-9-188710, JP-A-2000-131837, JP-A-2002-107916, Japanese Patent 2764769, JP-A-2002-116539 and Martin Kunz, *Rad Tech '98. Proceeding Apr.* 19-22, 1998, *Chicago*; organoboron sulfonium complexes and organoboron oxosulfonium complexes described in JP-A-6-157623, JP-A-6-175564 and JP-A-6-175561; organoboron iodonium complexes described in JP-A-6-175554 and JP-A-6-175553; organoboron phosphonium complexes described in JP-A-9-188710; and organoboron transition metal coordination complexes described in JP-A-6-348011, JP-A-7-128785, JP-A-7-140589, JP-A-7-306527 and JP-A-7-292014.

Examples of the disulfone compound include compounds described in JP-A-61-166544 and JP-A-2003-328465.

Examples of the oxime ester compound include compounds described in *J.C.S. Perkin II,* 1653-1660 (1979), *J.C.S. Perkin II,* 156-162 (1979), *Journal of Photopolymer Science and Technology,* 202-232 (1995), JP-A-2000-66385 and JP-A-2000-80068. Specific examples thereof include the compounds shown by the following structural formulae.

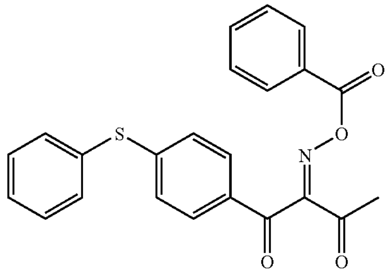

-continued

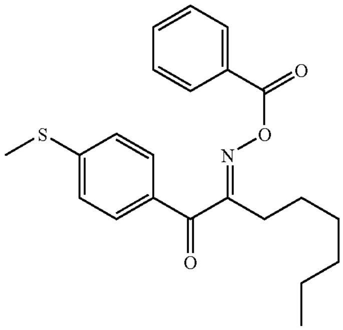

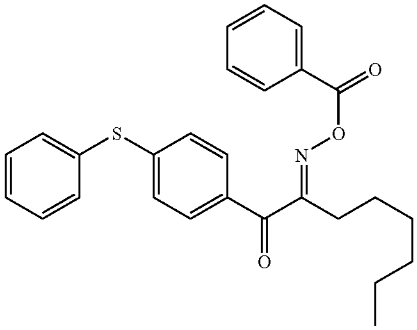

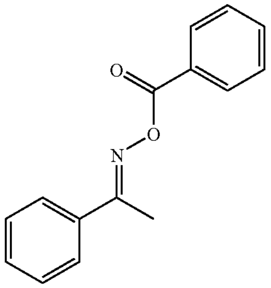

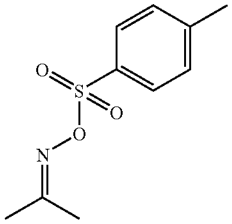

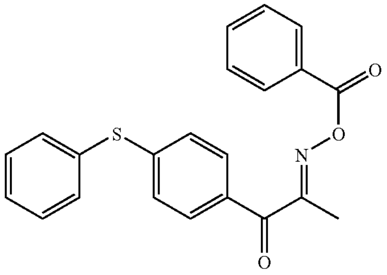

-continued
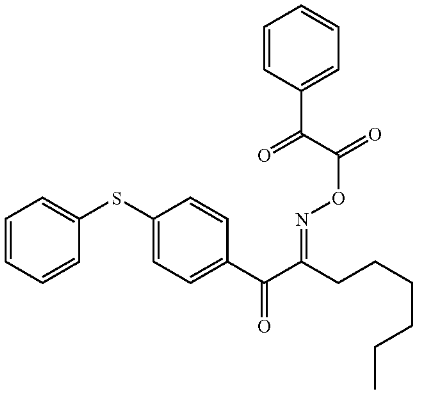
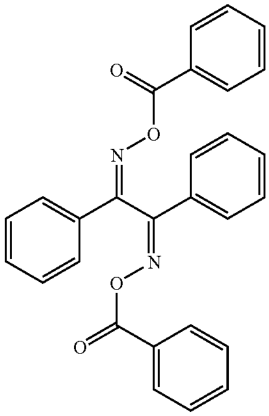
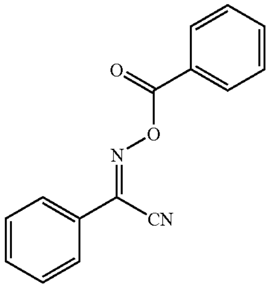
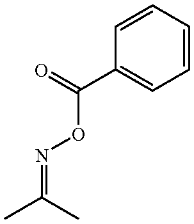
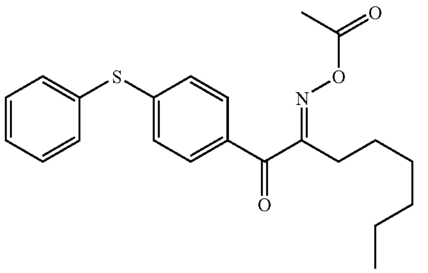
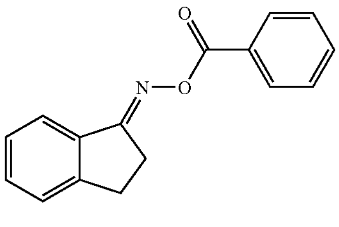
-continued
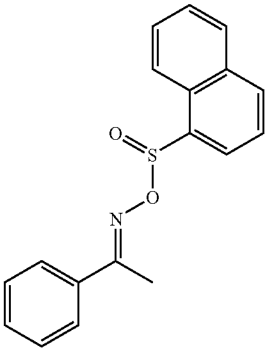
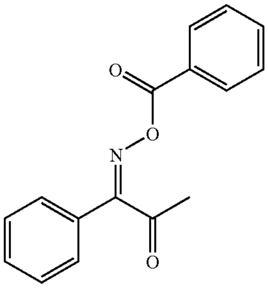
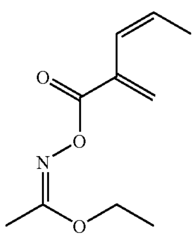
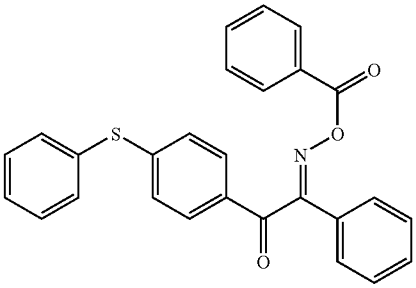
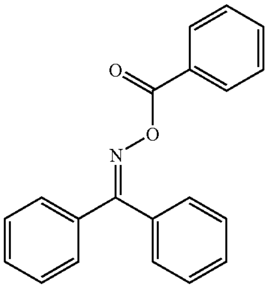
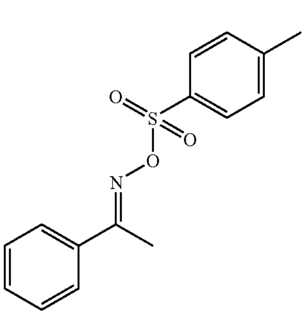
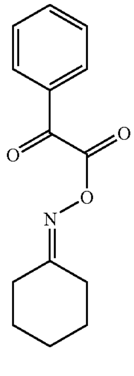

-continued

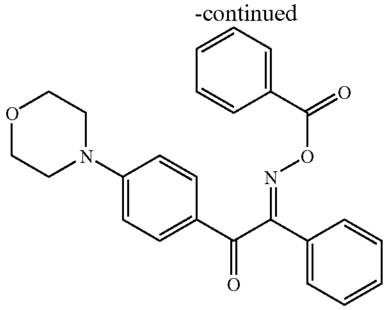

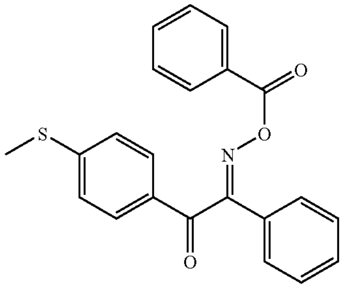

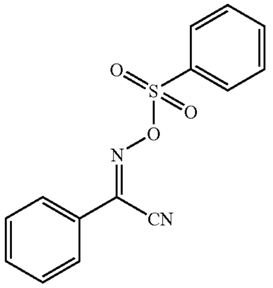

Examples of the onium salt compound include onium salts such as diazonium salts described in S. I. Schlesinger, *Photogr. Sci. Eng.,* 18, 387 (1974) and T. S. Bal et al., *Polymer,* 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Pat. Nos. 339,049 and 410,201, JP-A-2-150848 and JP-A-2-296514, sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833,827, and German Patents 2,904,626, 3,604,580 and 3,604,581, selenonium salts described in J. V. Crivello et al., *Macromolecules,* 10 (6), 1307 (1977) and J. V. Crivello et al., *J. Polymer Sci., Polymer Chem. Ed.,* 17, 1047 (1979), and arsonium salts described in C. S. Wen et al., *Teh. Proc. Conf. Rad. Curing ASIA*, p. 478, Tokyo, Oct. (1988).

Among these, an oxime ester compound and an onium salt (diazonium salt, iodonium salt or sulfonium salt) are preferred in view of reactivity and stability. In the present invention, such an onium salt acts as an ionic radical polymerization initiator but not as an acid generator.

The onium salt suitably used in the present invention is an onium salt represented by any one of the following formulae (RI-I) to (RI-III):

(RI-I)

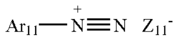

(RI-II)

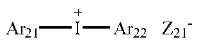

-continued (RI-III)

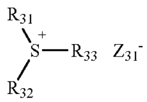

In formula (RI-I), $Ar_{11}$ represents an aryl group having 20 or less carbon atoms, which may have from 1 to 6 substituent(s), and preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{11}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, preferred in view of stability are perchlorate ion, hexafluorophosphate ion, tetrafluoroborate ion, sulfonate ion and sulfinate ion.

In formula (RI-II), $Ar_{21}$ and $Ar_{22}$ each independently represents an aryl group having 20 or less carbon atoms, which may have from 1 to 6 substituent(s), and preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{21}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, preferred in view of stability and reactivity are perchlorate ion, hexafluorophosphate ion, tetrafluoroborate ion, sulfonate ion, sulfinate ion and carboxylate ion.

In formula (RI-III), $R_{31}$, $R_{32}$ and $R_{33}$ each independently represents an aryl, alkyl, alkenyl or alkynyl group having 20 or less carbon atoms, which may have from 1 to 6 substituent(s), and in view of reactivity and stability, preferably an aryl group. Examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{31}^-$ represents a monovalent anion and specific examples thereof include halogen ion, perchlorate ion, hexafluorophosphate ion, tetrafluoroborate ion, sulfonate ion, sulfinate ion, thiosulfonate ion, sulfate ion and carboxylate ion. Among these, preferred in view of stability and reactivity are perchlorate ion, hexafluorophosphate ion, tetrafluoroborate ion, sulfonate ion, sulfinate ion and carboxylate ion. The carboxylate ion described in JP-A-2001-343742 is more preferred, and the carboxylate ion described in JP-A-2002-148790 is still more preferred.

Specific examples of the onium salt compound suitable for the present invention are set forth below, but the present invention is not limited thereto.

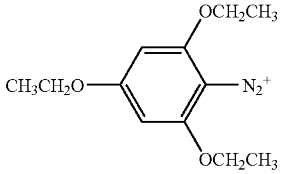

(N-1)

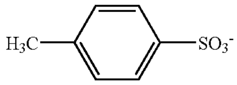

(N-2)

$PF_6^-$

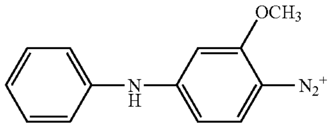

(N-3)

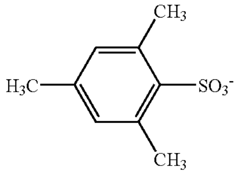

(N-4)

$ClO_4^-$ (N-5)

$PF_6^-$

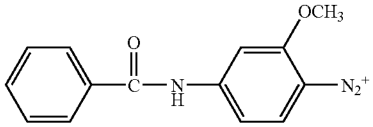

(N-6)

$CF_3SO_3^-$ (N-7)

$BF_4^-$

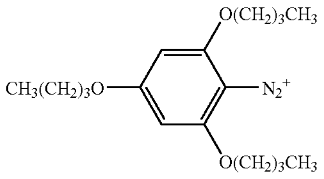

(N-8)

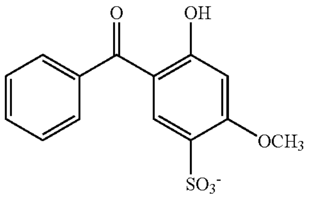

(N-9)

$ClO_4^-$

-continued

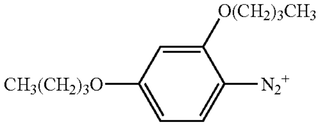

(N-10)

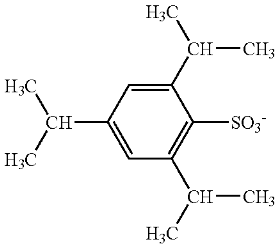

(N-11)

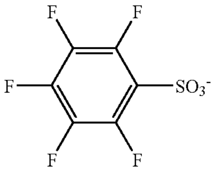

(N-12)

$PF_6^-$

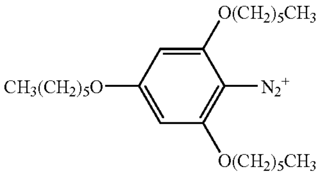

(N-13)

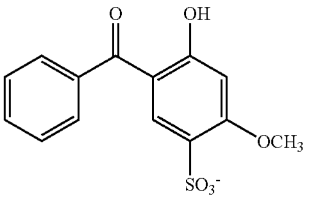

(N-14)

$ClO_4^-$ (N-15)

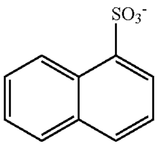

(N-16)

$PF_6^-$ (N-17)

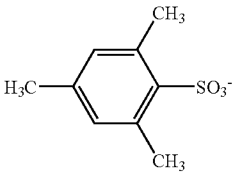

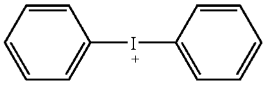

(I-1)

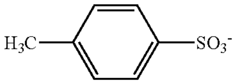

(I-2)

$PF_6^-$

-continued
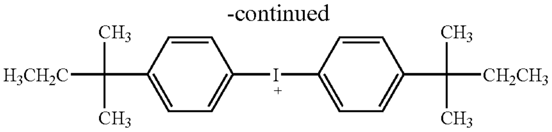
(I-3)
$PF_6^-$
(I-4)
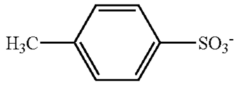
(I-5)
$ClO_4^-$
(I-6)
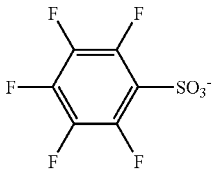
(I-7)
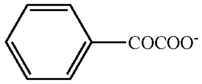
(I-8)
$CF_3SO_3^-$
(I-9)
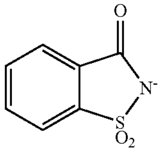
(I-10)
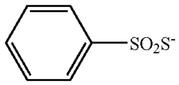
(I-11)
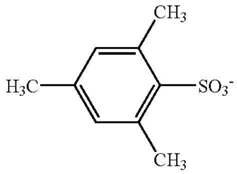
(I-12)
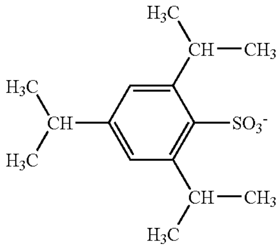
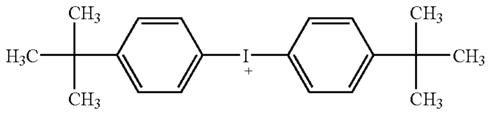
(I-13)
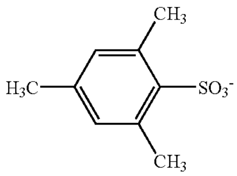
-continued
(I-14)
$ClO_4^-$
(I-15)
$PF_6^-$
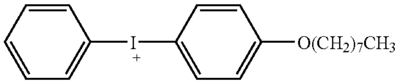
(I-16)
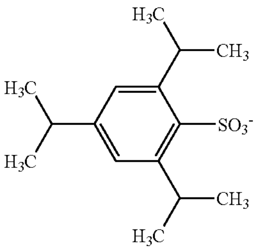
(I-17)
$CF_3COO^-$
(I-18)
$CF_3SO_3^-$
(I-19)
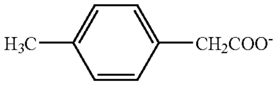
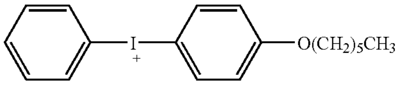
(I-20)
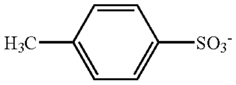
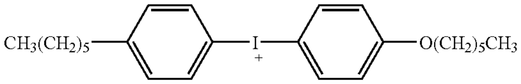
(I-21)
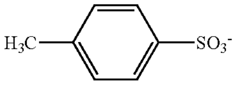
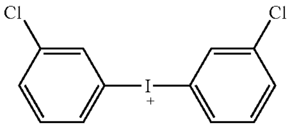
(I-22)
$BF_4^-$
(I-23)
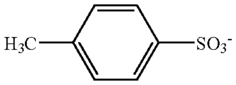
(I-18)
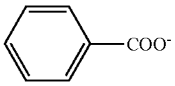
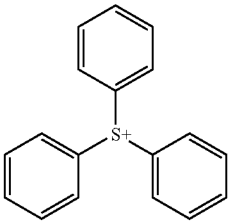

-continued
(S-1)
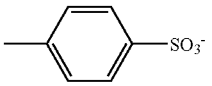
(S-2)
$PF_6^-$
(S-3)
$ClO_4^-$
(S-4)
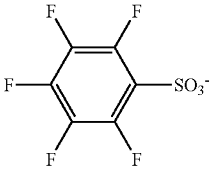
(S-5)
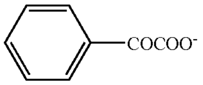
(S-6)
$CF_3SO_3^-$
(S-7)
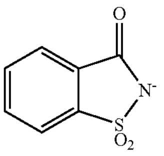
(S-8)
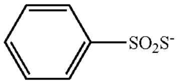
(S-9)
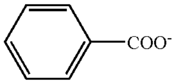
(S-10)
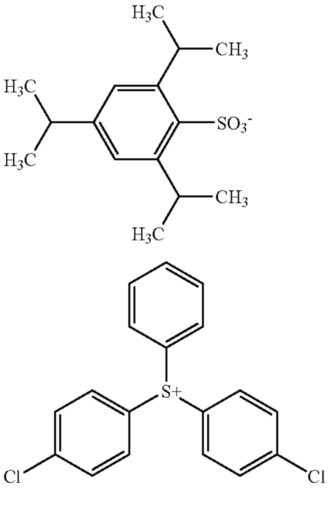
(S-11)
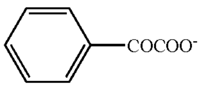
(S-12)
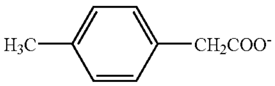
-continued
(S-13)
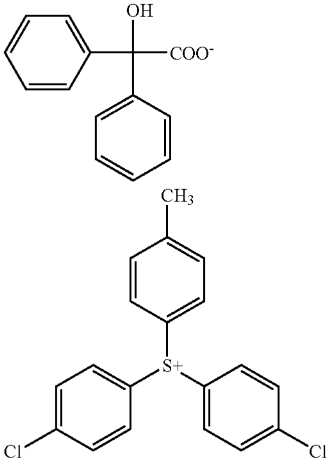
(S-14)
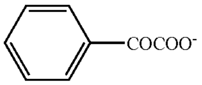
(S-15)
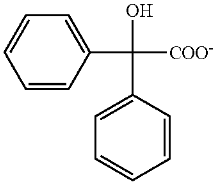
(S-16)
$BF_4^-$
(S-17)
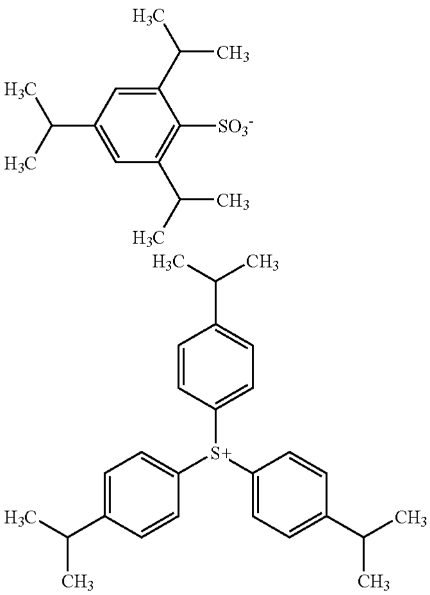
(S-18)
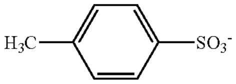
The amount of the polymerization initiator added is preferably from 0.1 to 50 mass %, more preferably from 0.5 to 30 mass %, still more preferably from 1 to 20 mass %, based on the entire solid content of the image recording layer. Within this range, good sensitivity and good anti-staining property of the non-image area at the printing can be obtained. One of these polymerization initiators may be used alone, or two or more thereof may be used in combination. Also, the polymerization initiator may be added together with other components in the same layer or may be added to a layer separately provided.

<(B) Polymerizable Monomer>

The polymerizable monomer which can be used in the present invention is an addition-polymerizable compound having at least one ethylenically unsaturated double bond and is selected from compounds having at least one, preferably two or more, ethylenically unsaturated bond(s). Such compounds are widely known in this industrial field and these known compounds can be used in the present invention without any particular limitation.

These compounds have a chemical mode such as monomer, prepolymer (that is, dimer, trimer or oligomer) or a mixture thereof. Examples of the polymerizable monomer include an unsaturated carboxylic acid (e.g., acrylic acid, methacrylic acid, itaconic acid, crotonic acid, isocrotonic acid, maleic acid), and esters and amides thereof. Among these, preferred are esters of an unsaturated carboxylic acid with an aliphatic polyhydric alcohol compound, and amides of an unsaturated carboxylic acid with an aliphatic polyvalent amine compound. Also, an addition reaction product of an unsaturated carboxylic acid ester or amide having a nucleophilic substituent such as hydroxyl group, amino group or mercapto group with a monofunctional or polyfunctional isocyanate or epoxy, and a dehydrating condensation reaction product with a monofunctional or polyfunctional carboxylic acid may be suitably used. Furthermore, an addition reaction product of an unsaturated carboxylic acid ester or amide having an electrophilic substituent such as isocyanate group or epoxy group with a monofunctional or polyfunctional alcohol, amine or thiol, and a displacement reaction product of an unsaturated carboxylic acid ester or amide having a desorptive substituent such as halogen group or tosyloxy group with a monofunctional or polyfunctional alcohol, amine or thiol may also be suitably used. In addition, compounds where the unsaturated carboxylic acid of the above-described compounds is replaced by an unsaturated phosphonic acid, styrene, vinyl ether or the like, may also be used.

Specific examples of the ester monomer of an aliphatic polyhydric alcohol compound with an unsaturated carboxylic acid include the followings. Examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer and isocyanuric acid EO-modified triacrylate.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaeryritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)-phenyl]dimethylmethane.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate. Examples of the crotonic acid ester include ethylene glycol dicrotonate, tetramethylene glycol dicrotonate, pentaerythritol dicrotonate and sorbitol tetradicrotonate. Examples of the isocrotonic acid ester include ethylene glycol diisocrotonate, pentaerythritol diisocrotonate and sorbitol tetraisocrotonate. Examples of the maleic acid ester include ethylene glycol dimaleate, triethylene glycol dimaleate, pentaerythritol dimaleate and sorbitol tetramaleate.

Other examples of the ester which can be suitably used include aliphatic alcohol-based esters described in JP-B-51-47334 and JP-A-57-196231, those having an aromatic skeleton described in JP-A-59-5240, JP-A-59-5241 and JP-A-2-226149, and those containing an amino group described in JP-A-1-165613. These ester monomers may also be used as a mixture.

Specific examples of the amide monomer of an aliphatic polyvalent amine compound with an unsaturated carboxylic acid include methylenebisacrylamide, methylene-bis-methacrylamide, 1,6-hexamethylenebisacrylamide, 1,6-hexamethylenebismethacrylamide, diethylenetriaminetrisacrylamide, xylylenebisacrylamide and xylylenebismethacrylamide. Other preferred examples of the amide-type monomer include those having a cyclohexylene structure described in JP-B-54-21726.

A urethane-based addition-polymerizable compound produced by using an addition reaction of isocyanate with a hydroxyl group is also preferred and specific examples thereof include a vinyl urethane compound having two or more polymerizable vinyl groups within one molecule described in JP-B-48-41708, which is obtained by adding a vinyl monomer having a hydroxyl group represented by the following formula (II) to a polyisocyanate compound having two or more isocyanate groups within one molecule:

$$CH_2{=}C(R_4)COOCH_2CH(R_5)OH \qquad (II)$$

(wherein $R_4$ and $R_5$ each represents H or $CH_3$).

In addition, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used. Furthermore, when addition-polymerizable compounds having an amino or sulfide structure within the molecule described in JP-A-63-277653, JP-A-63-260909 and JP-A-1-105238 are used, a photopolymerizable composition having very excellent photosensitization speed can be obtained.

Other examples include a polyfunctional acrylate or methacrylate such as polyester acrylates described in JP-A-48-64183, JP-B-49-43191 and JP-B-52-30490 and epoxy acrylates obtained by reacting an epoxy resin with a (meth)acrylic acid. Also, a specific unsaturated compound described in JP-B-46-43946, JP-B-1-40337 and JP-B-1-40336, a vinyl phosphonic acid-based compound described in JP-A-2-25493, or the like may be used. In some cases, a structure containing a perfluoroalkyl group described in JP-A-61-22048 is suitably used. Furthermore, those described as a photocurable monomer or oligomer in *Adhesion*, Vol. 20, No. 7, pp. 300-308 (1984) may also be used.

Details of the manner of use of these addition-polymerizable compounds, such as structure, sole or combination use and amount added, can be freely selected in accordance with the designed performance of the final lithographic printing plate precursor and, for example, may be selected from the following standpoints.

In view of sensitivity, a structure having a large unsaturated group content per one molecule is preferred and in most cases, a bifunctional or greater functional compound is preferred. For increasing the strength of image area, namely, cured layer, a trifunctional or greater functional compound is preferred. Also, a method of controlling both sensitivity and strength by using a combination of compounds differing in the functional number or in the polymerizable group (for example, an acrylic acid ester, a methacrylic acid ester, a styrene-based compound or a vinyl ether-based compound) is effective.

The selection and manner of use of the addition-polymerizable compound are important factors also in view of compatibility and dispersibility with other components (e.g., binder polymer, initiator, colorant) in the image recording layer. For example, the compatibility may be enhanced by using a low purity compound or using two or more compounds in combination. Also, a specific structure may be selected for the purpose of enhancing the adhesion to the substrate, protective layer which is described later, or the like.

The polymerizable monomer is preferably used in an amount of 5 to 80 mass %, more preferably from 25 to 75 mass %, based on all solid contents constituting the image recording layer. Also, one of these compounds may be used alone, or two or more thereof may be used in combination.

Other than the above-described manner of use of the polymerizable monomer, the structure, formulation and amount added can be appropriately selected at discretion by taking account of the degree of polymerization inhibition due to oxygen, resolution, fogging, change in refractive index, surface tackiness and the like. Depending on the case, a layer structure or coating method such as undercoat and overcoat can also be employed.

<(C) Binder Polymer>

As for the binder polymer which can be used in the present invention, conventionally known binder polymers can be used without limitation, and a polymer having a film property is preferred. Examples of such a binder polymer include acrylic resin, polyvinyl acetal resin, polyurethane resin, polyurea resin, polyimide resin, polyamide resin, epoxy resin, methacrylic resin, polystyrene-based resin, novolak-type phenol-based resin, polyester resin, synthetic rubber and natural rubber.

As more preferred binder polymers, (meth)acrylic resins, i.e., polymers of (meth)acrylic acid esters, are exemplified. Of such polymers, copolymers of alkyl (meth)acrylate and a monomer of a (meth)acrylic acid ester in which the R moiety of —COOR has a $—CH_2CH_2O—$ structure are preferred. The specific examples thereof are shown below, but the invention is not restricted thereto.

(1)

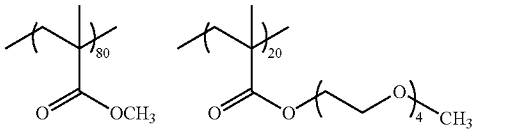

(2)

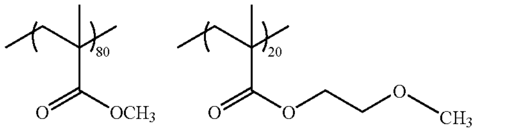

(3)

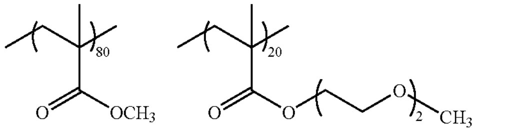

-continued (4)

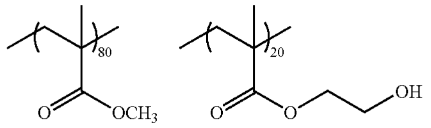

(5)

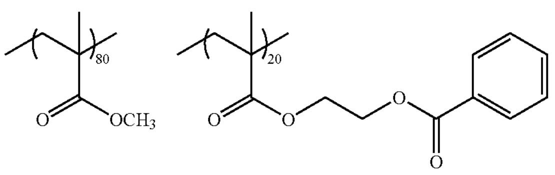

The binder polymer may have a crosslinking property so as to enhance the film strength in the image area. The crosslinking property may be imparted to the binder polymer by introducing a crosslinking functional group such as ethylenically unsaturated bond into the main or side chain of the molecule. The crosslinking functional group may be introduced by copolymerization.

Examples of the polymer having an ethylenically unsaturated bond in the main chain of the molecule include poly-1,4-butadiene and poly-1,4-isoprene.

Examples of the polymer having an ethylenically unsaturated bond in the side chain of the molecule include a polymer which is a polymer of acrylic or methacrylic acid ester or amide and in which the ester or amide residue (R in —COOR or —CONHR) has an ethylenically unsaturated bond.

Examples of the residue (R above) having an ethylenically unsaturated bond include $—(CH_2)_nCR^1═CR^2R^3$, $—(CH_2O)_n CH_2CR^1═CR^2R^3$, $—(CH_2CH_2O)_n CH_2CR^1═CR^2R^3$, $—(CH_2)_nNH—CO—O—CH_2CR^1═CR^2R^3$, $—(CH_2)_n—O—CO—CR^1═CR^2R^3$ and $—(CH_2CH_2O)_2—X$ (wherein $R^1$ to $R^3$ each represents a hydrogen atom, a halogen atom or an alkyl, aryl, alkoxy or aryloxy group having from 1 to 20 carbon atoms, $R^1$ and $R^2$ or $R^3$ may combine with each other to form a ring, n represents an integer of 1 to 10, and X represents a dicyclopentadienyl residue).

Specific examples of the ester residue include $—CH_2CH═CH_2$ (described in JP-B-7-21633), $—CH_2CH_2O—CH_2CH═CH_2$, $—CH_2C(CH_3)═CH_2$, $—CH_2CH═CH—C_6H_5$, $—CH_2CH_2OCOCH═CH—C_6H_5$, $—CH_2CH_2—NHCOO—CH_2CH═CH_2$ and $—CH_2CH_2O—X$ (wherein X represents a dicyclopentadienyl residue).

Specific examples of the amide residue include $—CH_2CH═CH_2$, $—CH_2CH_2—Y$ (wherein Y represents a cyclohexene residue) and $—CH_2CH_2—OCO—CH═CH_2$.

In the binder polymer having a crosslinking property, for example, a free radical (a polymerization initiating radical or a radical grown in the process of polymerization of a polymerizable compound) is added to the crosslinking functional group to cause addition-polymerization between polymers directly or through a polymerization chain of the polymerizable compound, as a result, crosslinking is formed between polymer molecules and thereby curing is effected. Alternatively, an atom (for example, a hydrogen atom on the carbon atom adjacent to the functional crosslinking group) in the polymer is withdrawn by a free radical to produce a polymer radical and the polymer radicals combine with each other to form crosslinking between polymer molecules, thereby effecting curing.

The content of the crosslinking group (content of radical-polymerizable unsaturated double bond determined by iodine titration) in the binder polymer is preferably from 0.1 to 10.0 mmol, more preferably from 1.0 to 7.0 mmol, and most preferably from 2.0 to 5.5 mmol, per g of the binder polymer. Within this range, good sensitivity and good storage stability can be obtained.

The binder polymer (C) can be synthesized by a conventionally know method. Examples of the solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide and water. One of these solvents is used alone, or two or more thereof are used as a mixture.

As for the radical polymerization initiator used in the synthesis of the binder polymer (C), known compounds such as azo-type initiator and peroxide initiator can be used.

In view of on-press developability of the image recording layer in the unexposed part, the binder polymer preferably has high solubility or dispersibility for an ink and/or a fountain solution.

The binder polymer is preferably lipophilic for enhancing the solubility or dispersibility in ink, and the binder polymer is preferably hydrophilic for enhancing the solubility or dispersibility in a fountain solution. Therefore, in the present invention, it is also effective to use a lipophilic binder polymer and a hydrophilic binder polymer in combination.

Preferred examples of the hydrophilic binder polymer include those having a hydrophilic group such as hydroxy group, carboxyl group, carboxylate group, hydroxyethyl group, polyoxyethyl group, hydroxypropyl group, polyoxypropyl group, amino group, aminoethyl group, aminopropyl group, ammonium group, amide group, carboxymethyl group, sulfonic acid group and phosphoric acid group.

Specific examples thereof include gum arabic, casein, gelatin, a starch derivative, carboxymethyl cellulose and a sodium salt thereof, cellulose acetate, sodium alginate, vinyl acetate-maleic acid copolymers, styrene-maleic acid copolymers, polyacrylic acids and salts thereof, polymethacrylic acids and salts thereof, a homopolymer and a copolymer of hydroxyethyl methacrylate, a homopolymer and a copolymer of hydroxyethyl acrylate, a homopolymer and a copolymer of hydroxypropyl methacrylate, a homopolymer and a copolymer of hydroxypropyl acrylate, a homopolymer and a copolymer of hydroxybutyl methacrylate, a homopolymer and a copolymer of hydroxybutyl acrylate, polyethylene glycols, hydroxypropylene polymers, polyvinyl alcohols, a hydrolyzed polyvinyl acetate having a hydrolysis degree of 60 mol % or more, preferably 80 mol % or more, polyvinyl formal, polyvinyl butyral, polyvinylpyrrolidone, a homopolymer and a copolymer of acrylamide, a homopolymer and a copolymer of methacrylamide, a homopolymer and a copolymer of N-methylolacrylamide, polyvinylpyrrolidone, alcohol-soluble nylon, and a polyether of 2,2-bis-(4-hydroxyphenyl)-propane with epichlorohydrin.

The binder polymer (C) preferably has a mass average molecular weight of 5,000 or more, more preferably from 10,000 to 300,000. The number average molecular weight thereof is preferably 1,000 or more, more preferably from 2,000 to 250,000. The polydispersity (mass average molecular weight/number average molecular weight) is preferably from 1.1 to 10.

The content of the binder polymer (C) is preferably from 5 to 90 mass %, more preferably from 5 to 80 mass %, still more preferably from 10 to 70 mass %, based on the entire solid content of the image recording layer. Within this range, good strength of image area and good image-forming property can be obtained.

The polymerizable compound (B) and the binder polymer (C) are preferably used in amounts of giving a mass ratio of 0.5/1 to 4/1.

<(D) Crosslinked Resin Particle Having Reactive Group>

The crosslinked resin particle having a reactive group for use in the present invention may be prepared by (1) a method utilizing granulation by interfacial polymerization described in JP-B-38-19574 and JP-B-42-446 or (2) a method utilizing granulation by non-aqueous dispersion polymerization described in JP-A-5-61214, but the preparation method is not limited thereto.

The reactive group may be selected from an ethylenically unsaturated group, an epoxy group, a hydroxyl group and an amino group. The selection of the reactive group may be usually decided by taking account of the reactivity with the polymerizable monomer and the reactivity with other components.

Each preparation method of the crosslinked resin particle having a reactive group is described in detail below.

In the method utilizing interfacial polymerization, the crosslinked resin particle may be obtained by applying a known production process for a microcapsule without using the inclusion but using only the compound usually used for the wall material.

The crosslinked resin particle for use in the present invention produced by interfacial polymerization preferably has a three-dimensionally crosslinked structure and has a capability of being modified with a reactive group. From such a standpoint, as for the main chain of the particle-forming material, a condensation-polymerization type polymer is preferred rather than an addition-polymerization type polymer. More specifically, polyurethane, polyurea, polyester, polyamide or a copolymer or mixture thereof is preferred, and polyurethane, polyurea or a copolymer or mixture thereof is more preferred.

The polyurethane is a polymer containing a urethane bond (—NH—CO—O—) in the main chain, the polyurea is a polymer containing a urea bond (—NH—CO—NH—) in the main chain, the polyamide is a polymer containing an amide bond (—CO—NH—) in the main chain, and the copolymer is a polymer containing two or more bonds in the main chain.

The method for producing the crosslinked resin particle having a reactive group includes a method of previously introducing a reactive group into the particle-forming material.

The method of previously introducing a reactive group into the particle-forming material is described below by referring to the case of using an ethylenically unsaturated bond as the reactive group.

Examples of the partial structure having a functional group containing an ethylenically unsaturated bond, which is previously introduced as the reactive group into the particle-forming material, include, but are not limited to, $(CH_2)_nCR^1{=}CR^2R^3$, $-(CH_2O)_nCH_2CR^1{=}CR^2R^3$, $-(CH_2CH_2O)_nCH_2CR^1{=}CR^2R^3$, $-(CH_2)_nNH-CO-O-CH_2CR^1{=}CR^2R^3$, $-(CH_2)_n-O-CO-CR^1{=}CR^2R^3$ and $-(CH_2CH_2O)_2-X$ (wherein $R^1$ to $R^3$ each represents a hydrogen atom, a halogen atom or an alkyl, aryl, alkoxy or aryloxy group having from 1 to 20 carbon atoms, $R^1$ and $R^2$ or $R^3$ may combine with each other to form a ring, n represents an integer of 1 to 10, and X represents a dicyclopentadienyl residue).

The ethylenically unsaturated bond is preferably present on the surface portion of the resin particle and therefore, the ethylenically unsaturated bond is preferably contained in the side chain moiety.

The compound containing an ethylenically unsaturated double bond for use in the synthesis of the resin particle is preferably defined by the following formula (III):

$$L^1Lc_mZ_n \quad \text{(III)}$$

wherein $L^1$ is an (m+n)-valent linking group; m an n each is independently an integer of 1 to 100; Lc is a monovalent group comprising an ethylenic double bond; and Z is a nucleophilic group.

$L^1$ is preferably a divalent or higher valent aliphatic group, a divalent or higher valent aromatic group, a divalent or higher valent heterocyclic group, —O—, —S—, —NH—, —N<, —CO—, —SO—, —$SO_2$— or a combination thereof.

m and n each is independently an integer of preferably from 1 to 50, more preferably from 1 to 20, still more preferably from 1 to 10, and most preferably from 1 to 5.

Z is preferably OH, SH or $NH_2$, more preferably OH or $NH_2$, and most preferably OH.

Examples of the compound containing an ethylenic double bond are set forth below, but the compound is not limited to these structures.

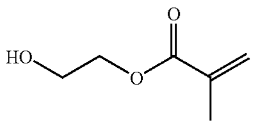
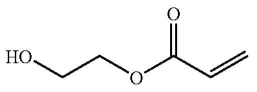
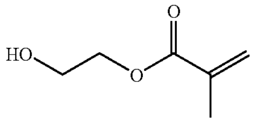
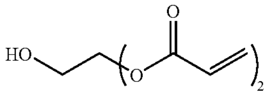
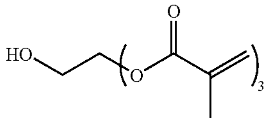
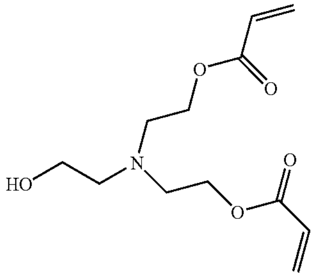
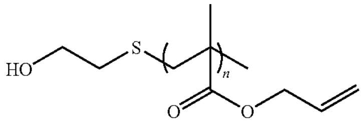
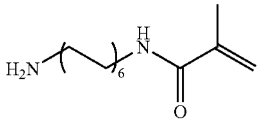
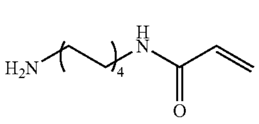
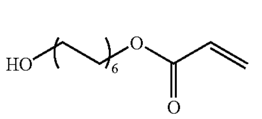
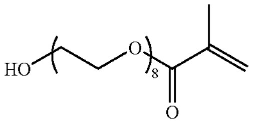

Two or more compounds containing an ethylenic double bond may be used in combination.

Also, by using a compound containing an ethylenic double bond and another polyol in combination, an adduct to a polyvalent isocyanate may be formed. An adduct of a compound containing an ethylenic double bond to a polyvalent isocyanate and an adduct of another polyol to a polyvalent isocyanate may also be used in combination. Furthermore, an adduct of another polyol to a polyvalent isocyanate may be reacted with a compound containing an ethylenic double bond to synthesize an ethylenic double bond-containing adduct (modification of the adduct).

In addition to the compound or polyol containing an ethylenic double bond, a polyvalent amine may be used for the formation of a shell polymer. The polyvalent amine is preferably water-soluble. Examples of the polyvalent amine include ethylenediamine, propylenediamine, phenylenediamine, diethylenetriamine, triethylenetetramine and tetraethylenepentamine.

The polyvalent isocyanate is preferably a diisocyanate defined by the following formula (IV):

$$OCN\text{-}L^4\text{-}NCO \quad \text{(IV)}$$

wherein $L^4$ is a divalent linking group. $L^4$ is preferably a divalent group selected from the group consisting of an alkylene group, a substituted alkylene group, an arylene group, a substituted arylene group and a combination thereof, more preferably a divalent linking group comprising an alkylene group and an arylene group.

The alkylene group may have a cyclic structure or a branched structure. The number of carbon atoms in the alkylene group is preferably from 1 to 20, more preferably from 1 to 15, still more preferably from 1 to 10, and most preferably from 1 to 8.

Examples of the substituent in the substituted alkylene group and the substituted alkyl group include a halogen atom, an oxo (═O), a thioxo (═S), an aryl group, a substituted aryl group and an alkoxy group.

The arylene group is preferably phenylene, and most preferably p-phenylene.

Examples of the substituent in the substituted arylene group and the substituted aryl group include a halogen atom, an alkyl group, a substituted alkyl group, an aryl group, a substituted aryl group and an alkoxy group.

Examples of the diisocyanate include xylylene diisocyanate (e.g., m-xylylene diisocyanate, p-xylylene diisocyanate), 4-chloro-m-xylylene diisocyanate, 2-methyl-m-xylylene diisocyanate, phenylene diisocyanate (e.g., m-phenylene diisocyanate, p-phenylene diisocyanate), tolylene diisocyanate (e.g., 2,6-tolylene diisocyanate, 2,4-tolylene diisocyanate), naphthalene diisocyanate (e.g., naphthalene-1,4-diisocyanate), isophorone diisocyanate, alkylene diisocyanate (e.g., trimethylene diisocyanate, hexamethylene diisocyanate, propylene-1,2-diisocyanate, butylene-1,3-diisocyanate, cyclohexylene-1,2-diisocyanate, cyclohexylene-1,3-diisocyanate, cyclohexylene-1,4-diisocyanate, dicyclohexylmethane-1,4-diisocyanate, 1,4-bis(isocyanatomethyl)cyclohexane, 1,3-bis(isocyanatomethyl)cyclohexane), diphenylmethane-4,4'-diisocyanate, 3,3'-dimethoxybiphenyl diisocyanate, 3,3'-dimethyldiphenylmethane-4,4'-diisocyanate, 4,4'-diphenylpropane diisocyanate, 4,4'-diphenylhexafluoropropane diisocyanate and lysin diisocyanate.

Among these, xylylene diisocyanate and tolylene diisocyanate are preferred, xylene diisocyanate is more preferred, and m-xylylene diisocyanate is still more preferred. Two or more diisocyanates may be used in combination.

The average particle diameter of the crosslinked resin particle is preferably from 0.01 to 3.0 μm, more preferably from 0.05 to 2.0 μm, still more preferably from 0.10 to 1.0 μm. Within this range, good resolution and good aging stability are obtained.

The crosslinked resin particle produced by non-aqueous dispersion polymerization is described below. As for the method utilizing granulation by non-aqueous dispersion polymerization, the preparation may be performed in the same manner as in the known method described in JP-A-5-61214 and JP-A-5-34950.

The crosslinked resin particle for use in the present invention is a particle of a polymer comprising a reactive group-containing repeating unit and a polymer component soluble in a non-aqueous solvent and having a structure where high-order crosslinking is formed between molecular chains (network dispersion resin particle).

The non-aqueous solvent used for the production of the non-aqueous solvent-system dispersion resin particle may be any organic solvent if it has a boiling point of 200° C. or less. One of these organic solvents may be used alone, or two or more thereof may be used as a mixture.

Specific examples of this organic solvent include alcohols (e.g., methanol, ethanol, propanol, butanol, fluorinated alcohol, benzylalcohol), ketones (e.g., acetone, methyl ethyl ketone, cyclohexanone, diethyl ketone), ethers (e.g., diethyl ether, tetrahydrofuran, dioxane), carboxylic acid esters (e.g., methyl acetate, ethyl acetate, butyl acetate, methyl propionate), aliphatic hydrocarbons having a carbon number of 6 to 14 (e.g., hexane, octane, decane, dodecane, tridecane, cyclohexane, cyclooctane), aromatic hydrocarbons (e.g., benzene, toluene, xylene, chlorobenzene), and halogenated hydrocarbons (e.g., methylene chloride, dichloroethane, tetrachloroethane, chloroform, methylchloroform, dichloropropane, trichloroethane), but the organic solvent is not limited to these compounds.

When the dispersion resin particle is synthesized by a dispersion polymerization method in such a non-aqueous solvent system, a resin particle having an average particle diameter of 0.8 μm or less can be easily obtained and moreover, monodisperse particles having a very narrow particle diameter distribution can be obtained.

The method therefor is specifically disclosed, for example, in K. B. J. Barrett, *Dispersion Polymerization in Organic Media*, John Wiley (1975), Koichiro Murata, *Kobunshi Kako* (*Polymer Processing*), 23, 20 (1974), Tsunetaka Matsumoto and Toyokichi Tange, *Journal of the Adhesion Society of Japan,* 9, 183 (1973), Toyokichi Tange, *Journal of the Adhesion Society of Japan,* 23, 26 (1987), D. J. Walbridge, *NATO. Adv. Study Inst. Ser. B.*, No. 67, 40 (1983), British Patents 893,429 and 934,038, U.S. Pat. Nos. 1,122,397, 3,900,412 and 4,606,989, JP-A-60-179751 and JP-A-60-185963.

The dispersion resin particle for use in the present invention is obtained by performing the synthesis in the state that at least one monomer (w) having a reactive group, at least one monomer (x) or oligomer copolymerizable with the monomer (w), which is soluble in a non-aqueous solvent but becomes insoluble in a non-aqueous solvent resulting from polymerization and copolymerization with other components, at least one polyfunctional monomer (y) as needed in the case of forming a network structure, and a dispersion-stabilizing resin (z) are present together. In any case, it is important that the resin particle synthesized from these monomers is insoluble in the non-aqueous solvent, and if the case is so, a desired dispersion resin particle can be obtained. More specifically, the dispersion-stabilizing resin (z) is preferably used in an amount of 1 to 50 mass %, more preferably from 2 to 30 mass %, based on the monomers (w) and (x). The molecular weight of the dispersion resin particle for use in the present invention is from $10^4$ to $10^6$, preferably from $10^4$ to $5\times10^5$.

The crosslinked resin particle for use in the present invention may be generally obtained by polymerizing under heat the monomer (w) having a reactive group, the monomer (x), the polyfunctional monomer (y) and the dispersion-stabilizing resin (z) in the presence of a polymerization initiator (e.g., benzoyl peroxide, azobisisobutyronitrile (AIBN), butyllithium) in a non-aqueous solvent. The crosslinked resin particle for use in the present invention is characterized by having a reactive group selected from an ethylenically unsaturated group, an epoxy group, a hydroxyl group and an amino group.

The monomer (x) for use in the crosslinked resin particle may be any monomer as long as it becomes insoluble in a non-aqueous solvent resulting from polymerization and copolymerization with other components.

Specific examples of such a monomer include vinyl or allyl esters of aliphatic carboxylic acid, such as vinyl acetate, vinyl propionate, vinyl butyrate, allyl acetate and allyl propionate; esters or amides of unsaturated carboxylic acid (e.g., acrylic acid, methacrylic acid, crotonic acid, itaconic acid, maleic acid, fumaric acid); styrene; a styrene derivative (e.g., vinyltoluene, α-methylstyrene); α-olefins; acrylonitrile; methacrylonitrile; and a vinyl group-substituted heterocyclic compound (e.g., N-vinylpyrrolidone).

The polyfunctional monomer in the crosslinked resin particle is used for the purpose of crosslinking the inside of the particle and may be any polyfunctional monomer as long as it copolymerizes with the above-described monomer. The crosslinking is required so that resistance against permeation of water or various chemicals can be imparted to the particle and at the same time, the function as a particle cannot be impaired by the fusion or the like under heat.

In the present invention, the crosslinking may be performed by a conventionally known crosslinking method. That is, a crosslinked structure can be introduced between molecules by causing a polyfunctional monomer or oligomer containing two or more polymerizable functional groups to coexist at the polymerization of a monomer.

Specific examples of the polymerizable group in the polyfunctional monomer (y) or polyfunctional oligomer having two or more polymerizable functional groups include $CH_2$═CH—$CH_2$—, $CH_2$═CH—CO—O—, $CH_2$═CH—, $CH_2$═C($CH_3$)—CO—O—, CH($CH_3$)═CH—CO—O—, $CH_2$═CH—CONH—, $CH_2$═C($CH_3$)—CONH—, CH($CH_3$)═CH—CONH—, $CH_2$═CH—O—CO—, $CH_2$═C($CH_3$)—O—CO—, $CH_2$═CH—$CH_2$—O—CO—, $CH_2$═CH—NHCO—, $CH_2$═CH—$CH_2$—NHCO—, $CH_2$═CH—$SO_2$—, $CH_2$═CH—CO—, $CH_2$═CH—O— and $CH_2$═CH—S—. The polyfunctional monomer or oligomer may be sufficient if it is a monomer or oligomer having two or more of these polymerizable groups, which are the same or different.

As for the monomer having two or more polymerizable functional groups, specific examples of the monomer or oligomer having the same polymerizable functional groups include a styrene derivative such as divinylbenzene and trivinylbenzene; methacrylic acid esters, acrylic acid esters, crotonic acid esters, vinyl ethers and allyl ethers of polyhydric alcohol (e.g., ethylene glycol, diethylene glycol, triethylene glycol, polyethylene glycols #200, #400 and #600, 1,3-butylene glycol, neopentyl glycol, dipropylene glycol, polypropylene glycol, trimethylolpropane, trimethylolethane, pentaerythritol) or hydroxyphenol (for example, hydroquinone, resorcin, catechol or a derivative thereof); vinyl esters, allyl esters, vinylamides and allylamides of dibasic acid (e.g., malonic acid, succinic acid, glutaric acid, adipic acid, pimelic acid, maleic acid, phthalic acid, itaconic acid); and a condensate of polyamine (e.g., ethylenediamine, 1,3-propylenediamine, 1,4-butylenediamine) and vinyl group-containing carboxylic acid (e.g., methacrylic acid, acrylic acid, crotonic acid, allylacetic acid).

Specific examples of the monomer or oligomer having different polymerizable functional groups include a vinyl group-containing ester derivative or amide derivative (e.g., vinyl methacrylate, vinyl acrylate, vinyl itaconate, allyl methacrylate, allyl acrylate, allyl itaconate, vinyl methacryloylacetate, vinyl methacryloylpropionate, allyl methacryloylpropionate, vinyloxycarbonylmethyl methacrylate, vinyloxycarbonylmethyloxycarbonylethylene acrylate, N-allylacrylamide, N-allylmethacrylamide, N-allylitaconic acid amide, methacryloylpropionic acid allylamide) of a reaction product between a vinyl group-containing carboxylic acid (e.g., methacrylic acid, acrylic acid, methacryloylacetic acid, acryloylacetic acid, methacryloylpropionic acid, acryloylpropionic acid, itaconiloylpropionic acid, carboxylic anhydride) and an alcohol or an amine, such as allyloxycarbonylpropionic acid, allyloxycarbonylacetic acid, 2-allyloxycarbonylbenzoic acid and allylaminocarbonylpropionic acid; and a condensate of aminoalcohols (e.g., aminoethanol, 1-aminopropanol, 1-aminobutanol, 1-aminohexanol, 2-aminobutanol) and a vinyl group-containing carboxylic acid.

In forming the resin for use in the present invention, the monomer or oligomer having two or more polymerizable functional groups is polymerized in an amount of 10 mol % or less, preferably 5 mol % or less, based on the total amount of the monomer and other coexisting monomers.

The monomer having a reactive group selected from an ethylenically unsaturated group, an epoxy group, a hydroxy group and an amino group, which is used in the crosslinked resin particle, functions in the same manner as the above-described monomer at the formation of particles so that a reactive group originated in the monomer having a reactive group can be introduced into the particle formed. This reactive group reacts with the polymerizable monomer or other components contained in the image recording layer, whereby the image formation can be strengthened. More specifically, the crosslinked resin particle having an objective reactivity can be obtained by causing the monomer having a reactive group to coexist at the time of forming particles according to the above-described method.

A monomer having an epoxy group, a hydroxyl group or an amino group may be used as the monomer having a reactive group. In the case of introducing an ethylenically unsaturated group, a reactive group such as epoxy group, hydroxyl group or amino group is previously introduced and then, an ethylenically unsaturated group can be introduced into the particle surface by a polymer reaction.

Specific examples of the monomer having an epoxy group include glycidyl (meth)acrylate; a monoester from an epoxy compound (e.g., propylene glycol diglycidyl ether, tripropylene glycol diglycidyl ether, neopentyl glycol diglycidyl ether, trimethylolpropane triglycidyl ether, hydroquinone diglycidyl ether, resorcinol diglycidyl ether, diglycidyl ether of bisphenol A) and a (meth)acrylic acid; 4-hydroxybutyl acrylate glycidyl ether; and 3,4-epoxycyclohexylmethyl acrylate.

Specific examples of the monomer having a hydroxyl group include a monomer having an alcoholic hydroxyl group, such as ethylene glycol mono(meth)acrylate, 1,3-propylene glycol mono(meth)acrylate, 1,2-propylene glycol mono(meth)acrylate, 1,4-butanediol mono(meth)acrylate, 1,3-butanediol mono(meth)acrylate, pentaerythritol mono (meth)acrylate, trimethylolpropane (meth)acrylate, dipentaerythritol (meth)acrylate, glycerin mono(meth)acrylate, sorbitol monoacrylate and dipentaerythritol monomethacrylate; and a monomer having a phenolic hydroxyl group, such as o-hydroxyphenyl (meth)acrylate, m-hydroxyphenyl (meth)acrylate, p-hydroxyphenyl (meth)acrylate, 2-(2-hydroxyphenyl)ethyl (meth)acrylate, 2-(3-hydroxyphenyl) ethyl (meth)acrylate and 2-(4-hydroxyphenyl)ethyl (meth) acrylate.

Specific examples of the monomer having an amino group include 2-aminoethyl (meth)acrylate, 3-aminopropyl (meth) acrylate, 3-amino-2-hydroxypropyl (meth)acrylate, N,N-dimethylaminoethyl (meth)acrylate, N,N-diethylaminoethyl acrylate and N,N-diethylaminoethyl (meth)acrylate.

In the case of further introducing an ethylenically unsaturated group, examples of the method therefor include a method where a compound having a functional group capable of causing a nucleophilic reaction, such as amino group, and an ethylenically unsaturated group within one molecule is introduced by a polymer reaction into the surface of the particle into which an epoxy group is introduced, a method where a compound having a functional group capable of causing esterification, such as carboxylic acid and carboxylic acid chloride, and an ethylenically unsaturated group within one molecule is introduced by a polymer reaction into the surface of the particle into which a hydroxyl group is introduced, and a method where a compound having a functional group of reacting with an electrophilic functional group, such as epoxy group and ester group, and an ethylenically unsaturated group within one molecule is introduced by a polymer reaction into the surface of the particle into which an amino group is introduced.

The amount of the monomer having a reactive group present in the crosslinked resin particle is preferably from 0.1 to 30 mass %, more preferably from 1 to 20 mass %, based on the entire particle mass.

The dispersion-stabilizing resin (z) for use in the present invention may be any polymer if it is soluble in the non-aqueous solvent, but specific examples thereof include polymers described in K. B. J. Barrett, *Dispersion Polymerization in Organic Media*, John Wiley and Sons (1975), R. Dowpenco and D. P. Hart, *Ind. Eng. Chem. Prod. Res. Develop.*, 12 (No. 1), 14 (1973), Toyokichi Tange, *Journal of the Adhesion Society of Japan*, 23 (1), 26 (1987), D. J. Walbridge, *NATO. Adv. Study Inst. Ser. E.*, No. 67, 40 (1983), and Y. Sasaki and M. Yabuta, *Proc. 10th, Int. Conf. Org. Coat. Sci. Technol.*, 10, 263 (1984).

For example, these polymers include an olefin polymer, a modified olefin polymer, a styrene-olefin copolymer, an aliphatic carboxylic acid vinyl ester copolymer, a modified maleic anhydride copolymer, a polyester polymer, a polyether polymer, a methacrylate homopolymer, an acrylate homopolymer, a methacrylate copolymer, an acrylate copolymer and an alkyd resin.

More specifically, the polymer component as a repeating unit of the dispersion-stabilizing resin for use in the present invention includes a component represented by the following formula (V):

Formula (V):

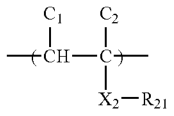

In formula (V), $X_2$ has the same meaning as $V_0$ in formula (VI) and this is referred to in detail in the description of $V_0$ of formula (VI).

$R_{21}$ represents an alkyl group having a carbon number of 1 to 22 which may be substituted (e.g., methyl, ethyl, propyl, butyl, pentyl, hexyl, octyl, nonyl, decyl, dodecyl, tridecyl, tetradecyl, hexadecyl, octadecyl, docosanyl, 2-(N,N-dimethylamino)ethyl, 2-(N-morpholino)ethyl, 2-chloroethyl, 2-bromoethyl, 2-hydroxyethyl, 2-cyanoethyl, 2-(α-thienyl) ethyl, 2-carboxyethyl, 2-methoxycarbonylethyl, 2,3-epoxypropyl, 2,3-diacetoxypropyl, 3-chloropropyl, 4-ethoxycarbonylbutyl), an alkenyl group having a carbon number of 3 to 22 which may be substituted (e.g., allyl, hexenyl, octenyl, decenyl, dodecenyl, tridecenyl, octadecenyl, oleyl, linoleyl), an aralkyl group having a carbon number of 7 to 22 which may be substituted (e.g., benzyl, phenethyl, 3-phenylpropyl, 2-naphthylmethyl, 2-(2'-naphthyl)ethyl, chlorobenzyl, bromobenzyl, methylbenzyl, dimethylbenzyl, trimethylbenzyl, methoxybenzyl, dimethoxybenzyl, butylbenzyl, methoxycarbonylbenzyl), an alicyclic group having a carbon number of 4 to 12 which may be substituted (e.g., cyclopentyl, cyclohexyl, cyclooctyl, adamantyl, chlorocyclohexyl, methylcyclohexyl, methoxycyclohexyl), an aromatic group having a carbon number of 6 to 22 which may be substituted (e.g., phenyl, tolyl, xylyl, mesityl, naphthyl, anthranyl, chlorophenyl, bromophenyl, butylphenyl, hexylphenyl, octylphenyl, decylphenyl, dodecylphenyl, methoxyphenyl, ethoxyphenyl, octyloxyphenyl, ethoxycarbonylphenyl, acetylphenyl, butoxycarbonylphenyl, butylmethylphenyl, N,N-dibutylaminophenyl, N-methyl-N-dodecylphenyl, thienyl, pyranyl), or the like.

$c_1$ and $c_2$ have the same meanings as $b_1$ and $b_2$ in formula (VI) and these are referred to in detail in the description of $b_1$ and $b_2$ of formula (VI).

Together with the above-described component, another polymer component may be contained as the polymer component in the dispersion-stabilizing resin for use in the present invention.

The another polymer component may be any monomer copolymerizable with the monomer corresponding to the component represented by formula (V). Examples of the monomer as the another polymer component include α-olefins, acrylonitrile, methacrylonitrile, vinyl-containing heterocyclic rings (examples of the heterocyclic ring include a pyrane ring, a pyrrolidone ring, an imidazole ring and a pyridine ring), vinyl group-containing carboxylic acids (e.g., acrylic acid, methacrylic acid, crotonic acid, itaconic acid, maleic acid), and vinyl-containing carboxamides (e.g., acrylamide, methacrylamide, crotonic acid amide, itaconic acid amide, itaconic acid half-amide, or itaconic acid diamide).

In the dispersion-stabilizing resin for use in the present invention, the polymer component represented by formula (V) occupies 30 parts by mass or more, preferably 50 parts by mass or more, per 100 parts by weight of the entire polymer of the resin.

The dispersion-stabilizing resin for use in the present invention is preferably a monofunctional polymer containing a polymerizable double bond group moiety represented by formula (VI) at one terminal of the main chain.

The polymerizable double bond group moiety is described below.

Formula (VI):

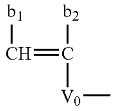

In formula (VI), $V_0$ represents —O—, —COO—, —OCO—, $—(CH_2)_p—OCO—$, $—(CH_2)_p—COO—$, $—SO_2—$, $—CONR_1$, $—SO_2NR_1$, $—C_6H_4$, —CONHCOO— or —CONHCONH— (p represents an integer of from 1 to 4).

$R_1$ represents a hydrogen atom or a hydrocarbon group, and preferred examples of the hydrocarbon group include an alkyl group having a carbon number of 1 to 18 which may be substituted (e.g., methyl, ethyl, propyl, butyl, heptyl, hexyl, octyl, decyl, dodecyl, hexadecyl, octadecyl, 2-chloroethyl, 2-bromoethyl, 2-cyanoethyl, 2-methoxycarbonylethyl, 2-methoxyethyl, 3-bromopropyl), an alkenyl group having a carbon number of 4 to 18 which may be substituted (e.g., 2-methyl-1-propenyl, 2-butenyl, 2-pentenyl, 3-methyl-2-pentenyl, 1-pentenyl, 1-hexenyl, 2-hexenyl, 4-methyl-2-hexenyl), an aralkyl group having a carbon number of 7 to 12 which may be substituted (e.g., benzyl, phenethyl, 3-phenylpropyl, naphthylmethyl, 2-naphthylethyl, chlorobenzyl, bromobenzyl, methylbenzyl, ethylbenzyl, methoxybenzyl, dimethylbenzyl, dimethoxybenzyl), an alicyclic group having a carbon number of 5 to 8 which may be substituted (e.g., cyclohexyl, 2-cyclohexylethyl, 2-cyclopentylethyl), and an aromatic group having a carbon number of 6 to 12 which may be substituted (e.g., phenyl, naphthyl, tolyl, xylyl, propylphenyl, butylphenyl, octylphenyl, dodecylphenyl, methoxyphenyl, ethoxyphenyl, butoxyphenyl, decyloxyphenyl, chlorophenyl, dichlorophenyl, bromophenyl, cyanophenyl, acetylphenyl, methoxycarbonylphenyl, ethoxycarbonylphenyl, butoxycarbonylphenyl, acetamidophenyl, propioamidophenyl, dodecyloylamidophenyl).

When $V_0$ represents $—C_6H_4—$, the benzene ring may have a substituent. Examples of the substituent include a halogen atom (e.g., chlorine, bromine), an alkyl group (e.g., methyl, ethyl, propyl, butyl, chloromethyl, methoxymethyl), and an alkoxy group (e.g., methoxy, ethoxy, propoxy, butoxy).

$b_1$ and $b_2$ may be the same or different and each preferably represents a hydrogen atom, a halogen atom (e.g., chlorine, bromine), a cyano group, an alkyl group having a carbon number of 1 to 4 (e.g., methyl, ethyl, propyl, butyl), $—COO—R_2$, or $—COO—R_2$ through the intervention of hydrocarbon (wherein $R_2$ represents a hydrogen atom or an alkyl, alkenyl, aralkyl, alicyclic or aryl group having a carbon number of 1 to 18 which may be substituted; specifically, $R_2$ has the same contents as those described above for $R_1$).

Examples of the hydrocarbon in the $—COO—R_2$ group through the intervention of hydrocarbon include a methylene group, an ethylene group and a propylene group.

More preferably, in formula (VI), $V_0$ represents —COO—, —OCO—, $—CH_2OCO—$, $—CH_2COO—$, —O—, —CONH—, $—SO_2NH—$, —CONHCOO— or $—C_6H_4—$, and $b_1$ and $b_2$, which may be the same or different, each represents a hydrogen atom, a methyl group, $—COOR_2$ or $—CH_2COOR_2$ (wherein $R_2$ represents a hydrogen atom or an alkyl group having a carbon number of 1 to 6 (e.g., methyl, ethyl, propyl, butyl, hexyl)). Still more preferably, either one of $b_1$ and $b_2$ necessarily represents a hydrogen atom.

Specific examples of the polymerizable double bond group moiety represented by formula (VI) include $CH_2═CH—CO—O—$, $CH_2═C(CH_3)—CO—O—$, $CH(CH_3)═CH—CO—O—$, $CH_2═C(CH_2COOCH_3)—CO—O—$, $CH_2═C(CH_2COOH)—CO—O—$, $CH_2═CH—CONH—$, $CH_2═C(CH_3)—CONH—$, $CH(CH_3)═CH—CONH—$, $CH_2═C(CH_3)—CONHCOO—$, $CH_2═CH—O—CO—$, $CH_2═CH—CH_2—O—CO—$, $CH_2═CH—O—$, $CH_2═C(COOH)—CH_2—CO—O—$, $CH_2═C(COOCH_3)—CH_2—CO—O—$ and $CH_2═CH—C_6H_4—$.

The monofunctional polymer [M] containing a polymerizable double bond group moiety at one terminal of the main chain, which is more preferred as the dispersion-stabilizing resin for use in the present invention, may be produced by a conventionally known synthesis method. Examples thereof include i) an ionic polymerization method where a monofunctional polymer [M] is obtained by reacting various reagents with the terminal of a living polymer obtained by anionic or cationic polymerization; ii) a radical polymerization method where a monofunctional polymer [M] is obtained by reacting various reagents with a reactive group-terminated polymer obtained by radical polymerization using a polymerization initiator and/or a chain transfer agent each having in its molecule a reactive group such as a carboxyl, hydroxyl or amino group; and iii) a polyaddition-condensation method where a polymerizable double bond group is introduced into a polymer obtained by polyaddition or polycondensation, in the same manner as in the above-described radical polymerization method.

More specifically, the synthesis may be performed according to the method described in general remarks of, for example, P. Dreyfuss & R. P. Quirk, *Encycl. Polym. Sci. Eng.*, 7, 551 (1987), P. F. Rempp and E. Franta, *Adv. Polym. Sci.*, 58, 1 (1984), V. Percec, *Appl. Poly. Sci.*, 285, 95 (1984), R. Asami and M. Takari, *Macromol. Chem. Suppl.*, 12, 163 (1985), P. Rempp et al., *Macromol. Chem. Suppl.*, 8, 3 (1984), Takashi Kawakami, *Kagaku Kogyo* (*Chemical Industry*), 38, 56 (1987), Yuya Yamashita, *Kobunshi* (*Polymer*), 31, 988 (1982), Shiro Kobayashi, *Kobunshi* (*Polymer*), 30, 625 (1981), Toshinobu Higashimura, *Journal of the Adhesion Society of Japan*, 18, 536 (1982), Koichi Ito, *Kobunshi Kako* (*Polymer Processing*), 35, 262 (1986), and Takashiro Azuma and Takashi Tsuda, *Kino Zairyo* (*Functional Material*), 1987, No. 10, 5, as well as in literatures, patents and the like cited therein.

The average particle diameter of the crosslinked resin particle is preferably from 0.01 to 3.0 μm, more preferably from 0.05 to 2.0 μm, still more preferably from 0.10 to 1.0 μm. Within this range, good resolution and good aging stability are obtained.

The total amount of the polymerizable compounds is approximately from 5 to 80 parts by mass, preferably from 10 to 50 parts by mass, per 100 parts by mass of the non-aqueous solvent.

The amount of the polymerization initiator is preferably from 0.1 to 5 mass % based on the total amount of the polymerizable compounds. Also, the polymerization temperature is preferably on the order of 30 to 180° C., more preferably from 40 to 120° C., and the reaction time is preferably from 1 to 15 hours.

The non-aqueous dispersion resin produced in this way becomes a fine particle with a uniform particle size distribution.

<(F) Microcapsule>

The microcapsule for use in the present invention is a microcapsule containing a polymerizable monomer at least in the capsule wall. Also, the microcapsule may enclose a polymerizable monomer. The polymerizable monomer enclosed in the microcapsule and contained in the capsule wall and the polymerizable monomer added outside the microcapsule may be the same or different. In addition to the polymerizable monomer, if desired, components added to the image recording layer, such as polymerization initiator and infrared absorbent, may be enclosed in this microcapsule.

As for the microencapsulation method, a known method may be applied. Examples of the production method of a microcapsule include, but are not limited to, a method utilizing coacervation described in U.S. Pat. Nos. 2,800,457 and 2,800,458, a method by interfacial polymerization described in U.S. Pat. No. 3,287,154, JP-B-38-19574 and JP-B-42-446, a method by polymer precipitation described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall-forming material described in U.S. Pat. Nos. 4,001,140, 4,087,376 and 4,089,802, a method using a wall material such as melamine-formaldehyde resin or hydroxy cellulose described in U.S. Pat. No. 4,025,445, an in situ method by monomer polymerization described in JP-B-36-9163 and JP-A-51-9079, a spray drying method described in British Patent 930,422 and U.S. Pat. No. 3,111,407, and an electrolytic dispersion cooling method described in British Patents 952,807 and 967,074.

The microcapsule wall which is preferably used in the present invention has a three-dimensionally crosslinked structure and has a property of swelling with a solvent. From this standpoint, the wall material of the microcapsule is preferably polyurea, polyurethane, polyester, polycarbonate, polyamide or a mixture thereof, more preferably polyurea or polyurethane. Also, a compound having a crosslinking functional group such as ethylenically unsaturated bond, which can be introduced into the binder polymer, may be introduced into the microcapsule wall.

Examples of the method for incorporating a polymerizable monomer into the capsule wall, which is a characteristic feature of the microcapsule for use in the present invention, include a method of enhancing affinity of the polymerizable monomer for the wall material by selecting a polymerizable monomer having a solubility parameter (SP value) close to that of the wall material or by using a polymerizable monomer having a hydroxyl group and reacting it with the capsule wall, a method of facilitating the incorporation into the wall at the production of the capsule wall by using a hydrophilic polymerizable monomer to decrease the solubility in the solvent of the oil phase, thereby causing the polymerizable monomer to readily stay at the aqueous phase-oil phase interface or decreasing the capsule wall-forming reaction rate, and a method of increasing the amount of the emulsifier to stabilize the polymerizable monomer at the aqueous phase-oil phase interface.

Examples of the method for confirming that the polymerizable monomer is contained in the capsule wall include the following methods.

(1) Confirmation by Measurement of Glass Transition Temperature

A centrifugal separation treatment is performed in a dispersion medium capable of dissolving the polymerizable monomer, the polymerizable monomer not used for the modification of the microcapsule is removed as a supernatant, and the glass transition temperature of the microcapsule separated as a residue is measured by a known method such as method using a differential scanning calorimeter and compared with the glass transition temperature of the microcapsule not containing the polymerizable monomer, whereby the modification can be confirmed. When modification to the wall is effected, the glass transition temperature decreases.

(2) Detection by X-Ray Photoelectron Analyzer

A method of detecting the polymerizable monomer present in the microcapsule separated according to the method of (1) above, by using an X-ray photoelectron analyzer (ESCA) may also be used. More specifically, for example, the chemical shift in the Cls spectrum of the carbonyl carbon contained in the acrylate group of the polymerizable compound may be detected. In this method, trace polymerizable compounds undetectable by the measurement of the glass transition temperature can also be detected.

(3) Confirmation by Dyeing

As described in Hironari Sano, *Bunseki* (*Analysis*), 2, 43-51 (1995), the carbon-carbon double bond moiety of the polymerizable monomer is dyed with osmium tetroxide and observed by a transmission electron microphotograph (TEM) or a scanning electron microscope (SEM). According to this method, the polymerizable monomer is dyed and the position where the polymerizable monomer is present can be confirmed.

The average particle diameter of the microcapsule is preferably from 0.01 to 3.0 μm, more preferably from 0.05 to 2.0 μm, still more preferably from 0.10 to 1.0 μm. Within this range, good resolution and good aging stability are obtained.

<Other Components of Image Recording Layer>

The image recording layer of the present invention may further contain other components as needed, such as surfactant, printing-out agent, colorant and polymerization inhibitor. These components are described below.

<Surfactant>

In the present invention, a surfactant is preferably used in the image recording layer so as to accelerate the on-press development at the initiation of printing and enhance the coated surface state. The surfactant includes a nonionic surfactant, an anionic surfactant, a cationic surfactant, an amphoteric surfactant, a fluorine-containing surfactant and the like. One surfactant may be used alone or two or more surfactants may be used in combination.

The nonionic surfactant for use in the present invention is not particularly limited and a conventionally known nonionic surfactant can be used. Examples thereof include polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylenated castor oils, polyoxyethylene glycerin fatty acid partial esters, fatty acid diethanolamides, N,N-bis-2-hydroxyalkylamines, polyoxyethylene alkylamines, a triethanolamine fatty acid ester, trialkylamine oxide, polyethylene glycol, and a copolymer of polyethylene glycol and polypropylene glycol.

The anionic surfactant for use in the present invention is not particularly limited and a conventionally known anionic surfactant can be used. Examples thereof include fatty acid salts, abietates, hydroxyalkanesulfonates, alkanesulfonates, dialkylsulfosuccinic ester salts, linear alkylbenzenesulfonates, branched alkylbenzenesulfonates, alkylnaphthalenesulfonates, alkyl-phenoxypolyoxyethylenepropylsulfonates, polyoxyethylenealkylsulfophenyl ether salts, N-methyl-N-oleyltaurine sodium salt, monoamide disodium N-alkylsulfosuccinate, petroleum sulfonates, sulfated beef tallow oil, sulfuric ester salts of fatty acid alkyl ester, alkylsulfuric ester salts, polyoxyethylene alkyl ether sulfuric ester salts, fatty acid monoglyceride sulfuric ester salts, polyoxyethylene alkylphenyl ether sulfuric ester salts, polyoxyethylene styrylphenyl ether sulfuric ester salts, alkylphosphoric ester salts, polyoxyethylene alkyl ether phosphoric ester salts, polyoxyethylene alkylphenyl ether phosphoric ester salts, partially saponified styrene/maleic anhydride copolymerization products, partially saponified olefin/maleic anhydride copolymerization products, and naphthalenesulfonate formalin condensates.

The cationic surfactant for use in the present invention is not particularly limited and a conventionally known cationic surfactant can be used. Examples thereof include alkylamine salts, quaternary ammonium salts, polyoxyethylenealkylamine salts and a polyethylene polyamine derivative.

The amphoteric surfactant for use in the present invention is not particularly limited and a conventionally known amphoteric surfactant can be used. Examples thereof include carboxybetaines, aminocarboxylic acids, sulfobetaines, aminosulfuric esters and imidazolines.

The term "polyoxyethylene" in the above-described surfactants can be instead read as "polyoxyalkylene" such as polyoxymethylene, polyoxypropylene and polyoxybutylene, and these surfactants can also be used in the present invention.

The surfactant is more preferably a fluorine-containing surfactant containing a perfluoroalkyl group within the molecule. This fluorine-containing surfactant includes an anionic type such as perfluoroalkylcarboxylate, perfluoroalkylsulfonate and perfluoroalkylphosphoric ester; an amphoteric type such as perfluoroalkylbetaine; a cationic type such as perfluoroalkyltrimethylammonium salt; and a nonionic type such as perfluoroalkylamine oxide, perfluoroalkyl ethylene oxide adduct, oligomer containing a perfluoroalkyl group and a hydrophilic group, oligomer containing a perfluoroalkyl group and a lipophilic group, oligomer containing a perfluoroalkyl group, a hydrophilic group and a lipophilic group, and urethane containing a perfluoroalkyl group and a lipophilic group. In addition, fluorine-containing surfactants described in JP-A-62-170950, JP-A-62-226143 and JP-A-60-168144 may also be suitably used.

One of these surfactants may be used alone or two or more thereof may be used in combination.

The surfactant content is preferably from 0.001 to 10 mass %, more preferably from 0.01 to 5 mass %, based on the entire solid content of the image recording layer.

<Colorant>

In the present invention, various compounds may be further added, if desired, in addition to the above-described components. For example, a dye having large absorption in the visible light region can be used as a colorant of the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes described in JP-A-62-293247. Also, pigments such as phthalocyanine-based pigment, azo-based pigment, carbon black and titanium oxide may be suitably used.

The colorant is preferably added, because the image area and the non-image area after image formation can be clearly distinguished. The amount of the colorant added is preferably from 0.01 to 10 mass % based on the entire solid content of the image recording material.

<Printing-Out Agent>

In the image recording layer of the present invention, a compound of changing in the color by the effect of an acid or a radical can be added so as to produce a printout image. As such a compound, various dyes of, for example, diphenylmethane type, triphenylmethane type, thiazine type, oxazine type, xanthene type, anthraquinone type, iminoquinone type, azo type and azomethine type, are effectively used.

Specific examples thereof include dyes such as Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH [produced by Hodogaya Chemical Co., Ltd.], Oil Blue #603 [produced by Orient Chemical Industry Co., Ltd.], Oil Pink #312 [produced by Orient Chemical Industry Co., Ltd.], Oil Red 5B [produced by Orient Chemical Industry Co., Ltd.], Oil Scarlet #308 [produced by Orient Chemical Industry Co., Ltd.], Oil Red OG [produced by Orient Chemical Industry Co., Ltd.], Oil Red RR [produced by Orient Chemical Industry Co., Ltd.], Oil Green #502 [produced by Orient Chemical Industry Co., Ltd.], Spiron Red BEH Special [produced by Hodogaya Chemical Co., Ltd.], m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes such as p,p',p''-hexamethyltriaminotriphenyl methane (Leuco Crystal Violet) and Pergascript Blue SRB (produced by Ciba Geigy).

Other suitable examples include a leuco dye known as a material for heat-sensitive or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl) aminofluorane, 2-anilino-3-methyl-6-(N-ethyl-p-toluidino) fluorane, 3,6-dimethoxyfluorane, 3-(N,N-diethylamino)-5-methyl-7-(N,N-dibenzylamino)fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The dye of changing in the color by the effect of an acid or a radical is preferably added in an amount of 0.01 to 10 mass % based on the solid content of the image recording layer.

<Polymerization Inhibitor>

In the image recording layer of the present invention, a small amount of a thermopolymerization inhibitor is preferably added so as to prevent unnecessary thermo-polymerization of the polymerizable monomer compound during the production or storage of the image recording layer.

Suitable examples of the thermopolymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermopolymerization inhibitor added is preferably from about 0.01 to about 5 mass % based on the entire solid content of the image recording layer.

<Higher Fatty Acid Derivative, Etc.>

In the image recording layer of the present invention, a higher fatty acid derivative such as behenic acid or behenic acid amide may be added and allowed to localize on the surface of the image recording layer in the process of drying after coating so as to prevent polymerization inhibition by oxygen. The amount of the higher fatty acid derivative added is preferably from about 0.1 to about 10 mass % based on the entire solid content of the image recording layer.

<Plasticizer>

The image recording layer of the present invention may contain a plasticizer for enhancing the on-press developability.

Suitable examples of the plasticizer include phthalic acid esters such as dimethyl phthalate, diethyl phthalate, dibutyl phthalate, diisobutyl phthalate, diocyl phthalate, octyl capryl phthalate, dicyclohexyl phthalate, ditridecyl phthalate, butyl benzyl phthalate, diisodecyl phthalate and diallyl phthalate; glycol esters such as dimethyl glycol phthalate, ethyl phthalylethyl glycolate, methyl phthalylethyl glycolate, butyl phthalylbutyl glycolate and triethylene glycol dicaprylic acid ester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate, triethyl citrate, glycerin triacetyl ester and butyl laurate.

The plasticizer content is preferably about 30 mass % or less based on the entire solid content of the image recording layer.

<Inorganic Fine Particle>

The image recording layer of the present invention may contain an inorganic fine particle so as to elevate the cured film strength in the image area and enhance the on-press developability of the non-image area.

Suitable examples of the inorganic fine particle include silica, alumina, magnesium oxide, titanium oxide, magnesium carbonate, calcium alginate and a mixture thereof. Such an inorganic fine particle can be used for strengthening the film or roughening the surface to enhance the adhesion at the interface, even if it has no light-to-heat converting property.

The average particle diameter of the inorganic fine particle is preferably from 5 nm to 10 μm, more preferably from 0.5 to 3 μm. Within this range, the inorganic particles are stably dispersed in the image recording layer, so that the image recording layer can maintain sufficiently high film strength and the non-image area formed can have excellent hydrophilicity and exhibit anti-staining property at printing.

Such an inorganic fine particle is easily available on the market as a colloidal silica dispersion or the like.

The inorganic fine particle content is preferably 40 mass % or less, more preferably 30 mass % or less, based on the entire solid content of the image recording layer.

<Low-Molecular Hydrophilic Compound>

The image recording layer of the present invention may contain a hydrophilic low-molecular compound so as to enhance the on-press developability. Examples of the hydrophilic low-molecular compound include, as a water-soluble organic compound, glycols and ether or ester derivatives thereof, such as ethylene glycol, diethylene glycol, triethylene glycol, propylene glycol, dipropylene glycol and tripropylene glycol; polyhydroxys such as glycerin and pentaerythritol; organic amines and salts thereof, such as triethanolamine, diethanolamine and monoethanolamine; organic sulfonic acids and salts thereof, such as toluenesulfonic acid and benzenesulfonic acid; organic phosphonic acids and salts thereof, such as phenylphosphonic acid; and organic carboxylic acids and salts thereof, such as tartaric acid, oxalic acid, citric acid, malic acid, lactic acid, gluconic acid and amino acids.

<Formation of Image Recording Layer>

The image recording layer of the present invention is formed by dispersing or dissolving the above-described necessary components in a solvent to prepare a coating solution and coating the obtained coating solution. Examples of the solvent used here include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyl lactone, toluene and water. One of these solvents is used alone or a mixture thereof is used. The solid content concentration of the coating solution is preferably from 1 to 50 mass %.

The image recording layer of the present invention may also be formed by dispersing or dissolving the same or different components described above in the same or different solvents to prepare a plurality of coating solutions and repeating the coating and drying multiple times.

The coated amount (solid content) of the image recording layer obtained on the support after coating and drying varies depending on the use but in general, is preferably from 0.3 to 3.0 g/$m^2$. Within this range, good sensitivity and good film properties of the image recording layer are obtained.

As for the coating method, various methods may be used and examples thereof include bar coater coating, rotary coating, spray coating, curtain coating, dip coating, air knife coating, blade coating and roll coating.

[Support]

The support for use in the lithographic printing plate precursor of the present invention is not particularly limited and may be sufficient if it is a dimensionally stable plate-like material. Examples thereof include paper, paper laminated with plastic (e.g., polyethylene, polypropylene, polystyrene), metal plate (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic film laminated or vapor-deposited with the above-described metal. Among these supports, polyester film and aluminum plate are preferred, and aluminum plate is more preferred because this is dimensionally stable and relatively inexpensive.

The aluminum plate is a pure aluminum plate, an alloy plate mainly comprising aluminum and containing trace heteroelements, or an aluminum or aluminum alloy thin film laminated with a plastic. Examples of the heteroelement contained in the aluminum alloy include silicon, iron, manganese, copper, magnesium, chromium, zinc, bismuth, nickel and titanium. The heteroelement content in the alloy is preferably 10 mass % or less. In the present invention, a pure aluminum plate is preferred, but perfectly pure aluminum is difficult to produce in view of refining technique and therefore, an aluminum plate containing trace heteroelements may be used. The aluminum plate is not particularly limited in its composition, and a conventionally known and commonly employed construction material can be appropriately used.

The thickness of the support is preferably from 0.1 to 0.6 mm, more preferably from 0.15 to 0.4 mm.

In advance of using the aluminum plate, the aluminum plate is preferably subjected to a surface treatment such as surface roughening and anodization. This surface treatment facilitates enhancing hydrophilicity and ensuring adhesion between the image recording layer and the support. Before surface-roughening the aluminum plate, a degreasing treatment for removing the rolling oil on the surface is performed, if desired, by using a surfactant, an organic solvent, an alkaline aqueous solution or the like.

The surface-roughening treatment of the aluminum plate surface is performed by various methods and examples thereof include a mechanical surface-roughening treatment, an electrochemical surface-roughening treatment (a surface-roughening treatment of electrochemically dissolving the surface) and a chemical surface-roughening treatment (a surface-roughening treatment of chemically and selectively dissolving the surface).

The mechanical surface-roughening treatment may be performed by using a known method such as ball polishing, brush polishing, blast polishing and buff polishing. Also, a transfer method of transferring an irregularity pattern at the aluminum rolling stage by using a roll having provided thereon irregularities may be used.

The method for the electrochemical surface-roughening treatment includes, for example, a method of passing an alternating or direct current in an electrolytic solution containing an acid such as hydrochloric acid or nitric acid. Also, a method using a mixed acid described in JP-A-54-63902 may be used.

The surface-roughened aluminum plate is, if desired, subjected to an alkali etching treatment using an aqueous solution of potassium hydroxide, sodium hydroxide or the like and after a neutralization treatment, further subjected to an anodization treatment, if desired, so as to enhance the abrasion resistance.

With respect to the electrolyte for use in the anodization treatment of the aluminum plate, various electrolytes of forming a porous oxide film may be used. In general, a sulfuric acid, a hydrochloric acid, an oxalic acid, a chromic acid or a mixed acid thereof is used. The electrolyte concentration is appropriately determined according to the kind of the electrolyte.

The anodization treatment conditions vary depending on the electrolyte used and therefore, cannot be unconditionally specified, but in general, the conditions are preferably such that the electrolyte concentration is from 1 to 80 mass %, the liquid temperature is from 5 to 70° C., the current density is from 5 to 60 A/dm$^2$, the voltage is from 1 to 100 V, and the electrolysis time is from 10 seconds to 5 minutes. The amount of the anodic oxide film formed is preferably from 1.0 to 5.0 g/m$^2$, more preferably from 1.5 to 4.0 g/m$^2$. Within this range, good press life and good scratch resistance in the non-image area of the lithographic printing plate are obtained.

As for the support used in the invention, the substrate having thereon an anodic oxide film after the above-described surface treatment may be used as-is, but in order to more improve adhesion to the upper layer, hydrophilicity, antiscumming property, heat insulation and the like, treatments described in JP-A-2001-253181 and JP-A-2001-322365, such as treatment for enlarging micropores of the anodic oxide film, treatment for pore-sealing micropores and surface-hydrophilizing treatment of dipping the substrate in an aqueous solution containing a hydrophilic compound, may be appropriately selected and applied. Of course, the enlarging treatment and pore-sealing treatment are not limited to those described in these patent publications and any conventionally known method may be employed.

The pore-sealing treatment for use in the present invention is not particularly limited, and a conventionally known method may be used. In particular, a pore-sealing treatment with an aqueous solution containing an inorganic fluorine compound, a pore-sealing treatment with water vapor, and a pore-sealing treatment with hot water are preferred. These treatments are described below.

<Pore-Sealing Treatment with Aqueous Solution Containing Inorganic Fluorine Compound>

The inorganic fluorine compound used in the pore-sealing treatment with an aqueous solution containing an inorganic fluorine compound is preferably a metal fluoride.

Specific examples thereof include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid and ammonium fluorophosphate. Among these, sodium fluorozirconate, sodium fluorotitanate, fluorozirconic acid and fluorotitanic acid are preferred.

The concentration of the inorganic fluorine compound in the aqueous solution is, in view of satisfactory sealing of micropores of the anodic oxide film, preferably 0.01 mass % or more, more preferably 0.05 mass % or more, and in view of antiscumming property, preferably 1 mass % or less, more preferably 0.5 mass % or less.

The aqueous solution containing an inorganic fluorine compound preferably further contains a phosphate compound. When a phosphate compound is contained, the hydrophilicity on the anodic oxide film surface is elevated and in turn, the on-press developability and antiscumming property can be enhanced.

Suitable examples of the phosphate compound include a phosphate of metal such as alkali metal and alkaline earth metal.

Specific examples thereof include zinc phosphate, aluminum phosphate, ammonium phosphate, diammonium hydrogenphosphate, ammonium dihydrogenphosphate, mono-ammonium phosphate, monopotassium phosphate, monosodium phosphate, potassium dihydrogenphosphate, dipotassium hydrogenphosphate, calcium phosphate, sodium ammonium hydrogenphosphate, magnesium hydrogenphosphate, magnesium phosphate, ferrous phosphate, ferric phosphate, sodium dihydrogenphosphate, sodium phosphate, disodium hydrogen-phosphate, lead phosphate, diammonium phosphate, calcium dihydrogenphosphate, lithium phosphate, phosphotungstic acid, ammonium phosphotungstate, sodium phosphotungstate, ammonium phosphomolybdate, sodium phosphomolybdate, sodium phosphite, sodium tripolyphosphate and sodium pyrophosphate. Among these, sodium dihydrogenphosphate, disodium hydrogenphosphate, potassium dihydrogenphosphate and dipotassium hydrogenphosphate are preferred.

The combination of the inorganic fluorine compound and the phosphate compound is not particularly limited, but the aqueous solution preferably contains at least sodium fluorozirconate as the inorganic fluorine compound and at least sodium dihydrogenphosphate as the phosphate compound.

The concentration of the phosphate compound in the aqueous solution is, in view of enhancement of the on-press developability and antiscumming property, preferably 0.01 mass % or more, more preferably 0.1 mass % or more, and in view of solubility, preferably 20 mass % or less, more preferably 5 mass % of less.

The ratio of respective compounds in the aqueous solution is not particularly limited, but the mass ratio between the inorganic fluorine compound and the phosphate compound is preferably from 1/200 to 10/1, more preferably from 1/30 to 2/1.

The temperature of the aqueous solution is preferably 20° C. or more, more preferably 40° C. or more, and preferably 100° C. or less, more preferably 80° C. or less.

The pH of the aqueous solution is preferably 1 or more, more preferably 2 or more, and preferably 11 or less, more preferably 5 or less.

The method for the pore-sealing treatment with an aqueous solution containing an inorganic fluorine compound is not particularly limited, but examples thereof include a dipping method and a spray method. One of these methods may be used alone once or multiple times, or two or more thereof may be used in combination.

In particular, a dipping method is preferred. In the case of performing the treatment by using a dipping method, the treating time is preferably 1 second or more, more preferably 3 seconds or more, and preferably 100 seconds or less, more preferably 20 seconds or less.

<Pore-Sealing Treatment with Water Vapor>

Examples of the method for the pore-sealing treatment with water vapor include a method of continuously or discontinuously bringing water vapor under applied pressure or normal pressure into contact with the anodic oxide film.

The temperature of the water vapor is preferably 80° C. or more, more preferably 95° C. or more, and preferably 105° C. or less.

The pressure of the water vapor is preferably from (atmospheric pressure−50 mmAq) to (atmospheric pressure+300 mmAq) (from $1.008\times10^5$ to $1.043\times10^5$ Pa).

The time period for which water vapor is contacted is preferably 1 second or more, more preferably 3 seconds or more, and preferably 100 seconds or less, more preferably 20 seconds or less.

<Pore-Sealing Treatment with Hot Water>

Examples of the method for the pore-sealing treatment with water vapor include a method of dipping the aluminum plate having formed thereon the anodic oxide film in hot water.

The hot water may contain an inorganic salt (e.g., phosphate) or an organic salt.

The temperature of the hot water is preferably 80° C. or more, more preferably 95° C. or more, and preferably 100° C. or less.

The time period for which the aluminum plate is dipped in hot water is preferably 1 second or more, more preferably 3 seconds or more, and preferably 100 seconds or less, more preferably 20 seconds or less.

[Backcoat Layer]

After the support is surface-treated or the undercoat layer is formed, a backcoat may be provided on the back surface of the support, if desired.

Suitable examples of the backcoat include a coat layer comprising a metal oxide, obtained by hydrolyzing and polycondensing an organic polymer compound described in JP-A-5-45885 or an organic or inorganic metal compound described in JP-A-6-35174. Among these, those using an alkoxy compound of silicon, such as $Si(OCH_3)_4$, $Si(OC_2H_5)_4$, $Si(OC_3H_7)_4$ and $Si(OC_4H_9)_4$, are preferred because the raw material is inexpensive and easily available.

[Undercoat Layer]

In the lithographic printing plate precursor of the present invention, an undercoat layer may be provided between the image recording layer and the support, if desired. Particularly, in the case of an on-press development-type lithographic printing plate precursor, the undercoat layer facilitates the separation of the image recording layer from the support in the unexposed part and therefore, the on-press developability is enhanced. Also, in the case of exposure with an infrared laser, the undercoat layer functions as a heat insulating layer and the heat generated upon exposure is prevented from diffusing into the support and is efficiently utilized, as a result, high sensitivity can be advantageously ensured.

Specific suitable examples of the undercoat layer compound (undercoat compound) include a silane coupling agent having an addition-polymerizable ethylenic double bond reactive group described in JP-A-10-282679, and a phosphorus compound having an ethylenic double bond reactive group described in JP-A-2-304441.

A most preferred undercoat compound is a polymer resin obtained by copolymerizing a monomer having an adsorptive group, a monomer having a hydrophilic group and a monomer having a crosslinking group.

An essential component of the polymer undercoat is an adsorptive group to the hydrophilic support surface. The presence or absence of absorptivity to the hydrophilic support surface can be judged, for example, by the following method.

A test compound is dissolved in a solvent capable of easily dissolving the compound to prepare a coating solution, and the coating solution is coated and dried on a support such that the coated amount after drying becomes 30 mg/m$^2$. Thereafter, the support having coated thereon the test compound is thoroughly washed with a solvent capable of easily dissolving the compound and after measuring the residual amount of the test compound which is not removed by washing, the amount adsorbed to the support is calculated. Here, in the measurement of the residual amount, the amount of the residual compound may be directly determined or the residual amount may be calculated after determining the amount of the test compound dissolved in the washing solution. The quantitative determination of the compound may be performed, for example, by fluorescent X-ray measurement, reflection spectral absorbance measurement or liquid chromatography measurement. The compound having adsorptivity to the support is a compound which remains in an amount of 0.5 mg/m$^2$ or more even when the above-described washing treatment is performed.

The adsorptive group to the hydrophilic support surface is a functional group capable of causing chemical bonding (e.g., ionic bonding, hydrogen bonding, coordination bonding, bonding by intermolecular force) with a substance (e.g., metal, metal oxide) or a functional group (e.g., hydroxyl group), which is present on the hydrophilic support surface. The adsorptive group is preferably an acid group or a cationic group.

The acid group preferably has an acid dissociation constant (pKa) of 7 or less. Examples of the acid group include a phenolic hydroxyl group, a carboxyl group, $—PO_3H_2$, $—OPO_3H_2$, $—CONHSO_2—$, $—SO_2NHSO_2—$ and $—COCH_2COCH_3$. In particular, a phosphoric acid group ($—OPO_3H_2$, $—PO_3H_2$) is preferred. Also, these acid groups may be a metal salt.

The cationic group is preferably an onium group. Examples of the onium group include an ammonium group, a phosphonium group, an arsonium group, a stibonium group, an oxonium group, a sulfonium group, a selenonium group, a stannonium group and an iodonium group. Among these, an ammonium group, a phosphonium group and a sulfonium group are preferred, an ammonium group and a phosphonium group re more preferred, and an ammonium group is most preferred.

Particularly preferred examples include the compounds represented by the following formulae (VII) and (VIII).

(VII)

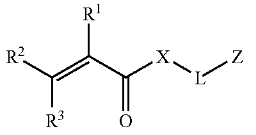

(VIII)

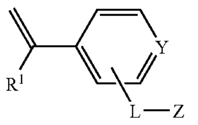

In formula (VII), $R^1$, $R^2$ and $R^3$ each independently represents a hydrogen atom, a halogen atom or an alkyl group having from 1 to 6 carbon atoms. $R^1$, $R^2$ and $R^3$ each is independently preferably a hydrogen atom or an alkyl group having from 1 to 6 carbon atoms, more preferably a hydrogen atom or an alkyl group having from 1 to 3 carbon atoms, and most preferably a hydrogen atom or a methyl group. In particular, $R^2$ and $R^3$ each is preferably a hydrogen atom.

In formula (VII), X represents an oxygen atom (—O) or an imino (—NH—). X is preferably an oxygen atom. In formula (VII), L represents a divalent linking group. L is preferably a divalent aliphatic group (e.g., alkylene, substituted alkylene, alkenylene, substituted alkenylene, alkynylene, substituted alkynylene), a divalent aromatic group (e.g., arylene, substituted arylene), a divalent heterocyclic group, or a combination of such a group with an oxygen atom (—O—), a sulfur atom (—S—), an imino (—NH—), a substituted imino (—NR—, wherein R is an aliphatic group, an aromatic group or a heterocyclic group) or a carbonyl (—CO—).

The aliphatic group may have a cyclic structure or a branched structure. The number of carbon atoms in the aliphatic group is preferably from 1 to 20, more preferably from 1 to 15, and most preferably from 1 to 10. The aliphatic group is preferably a saturated aliphatic group rather than an unsaturated aliphatic group. The aliphatic group may have a substituent. Examples of the substituent include a halogen atom, a hydroxyl group, an aromatic group and a heterocyclic group.

The number of carbon atoms in the aromatic group is preferably from 6 to 20, more preferably from 6 to 15, and most preferably from 6 to 10. The aromatic group may have a substituent. Examples of the substituent include a halogen atom, a hydroxyl group, an aliphatic group, an aromatic group and a heterocyclic group.

The heterocyclic group preferably has a 5- or 6-membered ring as the heterocyclic ring. The heterocyclic ring may be condensed with another heterocyclic ring, an aliphatic ring or an aromatic ring. The heterocyclic group may have a substituent. Examples of the substituent include a halogen atom, a hydroxyl group, an oxo group (=O), a thioxo group (=S), an imino group (=NH), a substituted imino group (=N—R, wherein R is an aliphatic group, an aromatic group or a heterocyclic group), an aliphatic group, an aromatic group and a heterocyclic group.

L is preferably a divalent linking group containing a plurality of polyoxyalkylene structures. The polyoxyalkylene structure is preferably a polyoxyethylene structure. In other words, L preferably contains $—(OCH_2CH_2)_n—$ (wherein n is an integer of 2 or more).

In formula (VII), Z is a functional group which adsorbs to the hydrophilic support surface. Also, in formula (VIII), Y is a carbon atom or a nitrogen atom. When Y is a nitrogen atom and L is connected on Y to form a quaternary pyridinium group, the quaternary pyridinium group itself exhibits adsorptivity and therefore, Z is not essential.

The adsorptive functional group is as described above.

In formula (VIII), $R^1$, L and Z have the same meanings as those in formula (VII), respectively.

Representative examples of the compounds represented by formulae (VII) and (VIII) are set forth below.

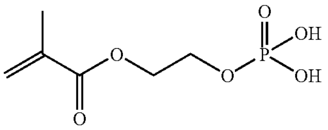

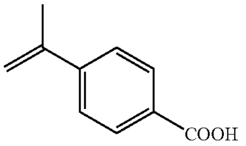

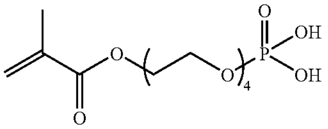

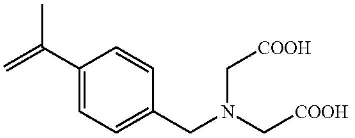

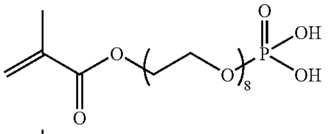

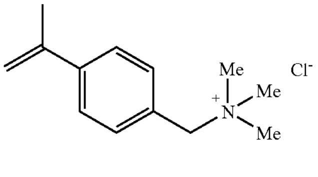

-continued

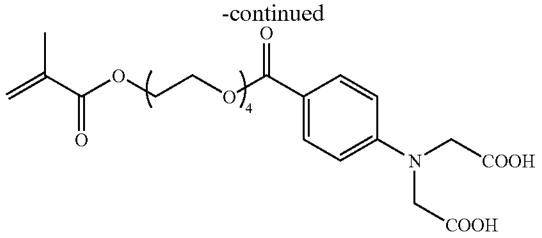

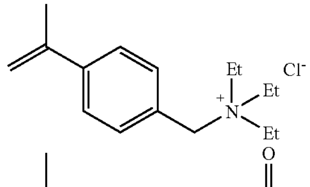

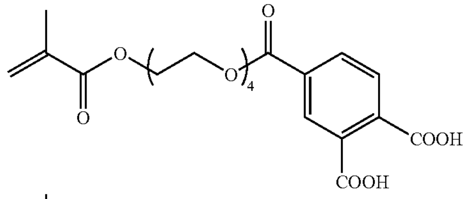

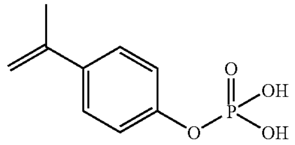

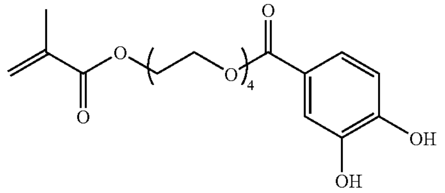

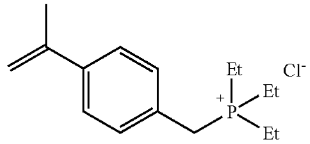

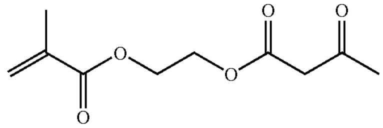

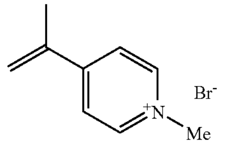

Preferred examples of the hydrophilic group of the polymer resin for undercoating, which can be used in the present invention, include those having a sulfonic acid group exhibiting high hydrophilicity. Specific examples thereof include a sodium salt and an amine salt of methallyloxybenzenesulfonic acid, allyloxybenzenesulfonic acid, allylsulfonic acid, vinylsulfonic acid, p-styrenesulfonic acid, methallylsulfonic acid, acrylamide tert-butylsulfonic acid, 2-acrylamide-2-methylpropanesulfonic acid and (3-acryloyloxypropyl)butylsulfonic acid. Among these, sodium 2-acrylamide-2-methylpropanesulfonate is preferred because of its hydrophilic performance and easy handleability in the synthesis.

The polymer resin for undercoating, which is used in the present invention, preferably has a crosslinking property for more elevating the adhesion to the image area. The crosslinking property may be imparted to the polymer resin for undercoating by introducing a crosslinking functional group such as ethylenically unsaturated bond into the side chain of the polymer or by forming a salt structure between a polar substituent of the polymer resin and a compound containing a substituent having a counter charge and an ethylenically unsaturated bond, thereby introducing a crosslinking functional group.

Examples of the polymer having an ethylenically unsaturated bond in the side chain of the molecule include a polymer which is a polymer of acrylic or methacrylic acid ester or amide and in which the ester or amide residue (R in —COOR or —CONHR) has an ethylenically unsaturated bond.

Examples of the residue (R above) having an ethylenically unsaturated bond include $-(CH_2)_nCR_1{=}CR_2R_3$, $-(CH_2O)_n CH_2CR_1{=}CR_2R_3$, $-(CH_2CH_2O)_n CH_2CR_1{=}CR_2R_3$, $-(CH_2)_nNH-CO-O-CH_2CR_1{=}CR_2R_3$, $-(CH_2)_n-O-CO-CR_1{=}CR_2R_3$ and $-(CH_2CH_2O)_2-X$ (wherein $R_1$ to $R_3$ each represents a hydrogen atom, a halogen atom or an alkyl, aryl, alkoxy or aryloxy group having from 1 to 20 carbon atoms, $R_1$ and $R_2$ or $R_3$ may combine with each other to form a ring, n represents an integer of 1 to 10, and X represents a dicyclopentadienyl residue).

Specific examples of the ester residue include $-CH_2CH{=}CH_2$ (described in JP-B-7-21633), $-CH_2CH_2O-CH_2CH{=}CH_2$, $-CH_2C(CH_3){=}CH_2$, $-CH_2CH{=}CH-C_6H_5$, $-CH_2CH_2OCOCH{=}CH-C_6H_5$, $-CH_2CH_2-NHCOO-CH_2CH{=}CH_2$ and $-CH_2CH_2O-X$ (wherein X represents a dicyclopentadienyl residue).

Specific examples of the amide residue include $-CH_2CH{=}CH_2$, $-CH_2CH_2O-Y$ (wherein Y represents a cyclohexene residue) and $-CH_2CH_2OCO-CH{=}CH_2$.

The content of the crosslinking group (content of radical-polymerizable unsaturated double bond determined by iodine titration) in the polymer resin for undercoating is preferably from 0.01 to 10.0 mmol, more preferably from 0.1 to 7.0 mmol, and most preferably from 0.2 to 5.5 mmol, per g of the polymer resin. Within this range, both good sensitivity and good anti-staining property can be established, and good storage stability can be obtained.

The mass average molecular weight of the polymer resin for undercoating is preferably 5,000 or more, more preferably from 10,000 to 300,000, and the number average molecular weight is preferably 1,000 or more, more preferably from 2,000 to 250,000. The polydispersity (mass average molecular weight/number average molecular weight) is preferably from 1.1 to 10.

The polymer resin for undercoating may be any polymer such as random polymer, block polymer or graft polymer, but is preferably a random polymer.

As for the copolymerization substituent of the polymer undercoat, which can be used in the present invention, a conventionally known copolymerization substituent may be used without limitation, but suitable examples of the hydrophilic copolymerization substituent include those having a hydrophilic group such as hydroxy group, carboxyl group, carboxylate group, hydroxyethyl group, polyoxyethyl group, hydroxypropyl group, polyoxypropyl group, amino group, aminoethyl group, aminopropyl group, ammonium group, amide group, carboxymethyl group, sulfonic acid group and phosphoric acid group.

Specific examples thereof include sodium alginate, vinyl acetate-maleic acid copolymers, styrene-maleic acid copolymers, polyacrylic acids and salts thereof, polymethacrylic acids and salts thereof, a homopolymer and a copolymer of hydroxyethyl methacrylate, a homopolymer and a copolymer of hydroxyethyl acrylate, a homopolymer and a copolymer of hydroxypropyl methacrylate, a homopolymer and a copolymer of hydroxypropyl acrylate, a homopolymer and a copolymer of hydroxybutyl methacrylate, a homopolymer and a copolymer of hydroxybutyl acrylate, polyethylene glycols, hydroxypropylene polymers, polyvinyl alcohols, a hydrolyzed polyvinyl acetate having a hydrolysis degree of 60 mol % or more, preferably 80 mol % or more, polyvinyl formal, polyvinyl butyral, polyvinylpyrrolidone, a homopolymer and a copolymer of acrylamide, a homopolymer and a copolymer of methacrylamide, a homopolymer and a copolymer of N-methylolacrylamide, polyvinylpyrrolidone, alcohol-soluble nylon, and a polyether of 2,2-bis-(4-hydroxyphenyl)-propane with epichlorohydrin.

One of the polymer resins for undercoating may be used alone, or two or more thereof may be used as a mixture. Also, two or more of the compounds having a functional group adsorptive to the hydrophilic support surface may be used in combination.

The coated amount (solid content) of the undercoat layer is preferably from 0.1 to 100 mg/m$^2$, more preferably from 1 to 30 mg/m$^2$.

[Protective Layer]

In the lithographic printing plate precursor of the present invention for use in the lithographic printing method of the present invention, a protective layer may be provided on the image recording layer, if desired, for the purpose of preventing generation of scratches or the like on the image recording layer, blocking oxygen or preventing ablation at the exposure with a high-intensity laser.

In the present invention, the exposure is usually performed in air and the protective layer prevents a low molecular compound which inhibits an image-forming reaction occurring upon exposure in the image recording layer, such as oxygen and basic substance present in air, from intruding into the image recording layer, and thereby prevents the inhibition of the image-forming reaction at the exposure in air. Accordingly, the property required of the protective layer is low permeability to a low molecular compound such as oxygen. Furthermore, the protective layer preferably has good transparency to light used for exposure, excellent adhesion to the image recording layer, and easy removability during on-press development after exposure. The protective layer having such properties have been heretofore variously studied and described in detail, for example, in U.S. Pat. No. 3,458,311 and JP-B-55-49729.

Examples of the material used for the protective layer include a water-soluble polymer compound having relatively excellent crystallinity. Specific examples thereof include a water-soluble polymer such as polyvinyl alcohol, polyvinylpyrrolidone, acidic celluloses, gelatin, gum arabic and polyacrylic acid. In particular, when polyvinyl alcohol (PVA) is used as the main component, this provides most excellent results for the basic properties such as oxygen-blocking property and development removability. The polyvinyl alcohol may be partially replaced by an ester, an ether or an acetal or may partially have another copolymerization component as long as it contains an unsubstituted vinyl alcohol unit for giving necessary oxygen-blocking property and water solubility to the protective layer.

Examples of the polyvinyl alcohol which can be suitably used include those having a hydrolysis degree of 71 to 100% and a polymerization degree of 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd.

The component (for example, selection of PVA and use of additive), coated amount and the like of the protective layer are appropriately selected by taking account of fogging, adhesion, scratch resistance and the like in addition to the oxygen-blocking property and development removability. In general, as the PVA has a higher percentage of hydrolysis (namely, as the unsubstituted vinyl alcohol unit content in the protective layer is higher) or as the layer thickness is larger, the oxygen-blocking property is elevated and this is preferred in view of sensitivity. Also, in order to prevent occurrence of an unnecessary polymerization reaction during production or storage and prevent unnecessary fogging or thickening of image line at the image exposure, excessively high oxygen permeability is not preferred. Accordingly, the oxygen permeability A at 25° C. under 1 atm is preferably $0.2 \leqq A \leqq 20$ (ml/m$^2$·day).

As for other components of the protective layer, glycerin, dipropylene glycol or the like may be added in an amount corresponding to several mass % based on the (co)polymer to impart flexibility. Also, an anionic surfactant such as sodium alkylsulfate and sodium alkylsulfonate; an amphoteric surfactant such as alkylaminocarboxylate and alkylaminodicarboxylate; or a nonionic surfactant such as polyoxyethylene alkylphenyl ether may be added in an amount of several mass % based on the (co)polymer.

The thickness of the protective layer is suitably from 0.05 to 4 μm, preferably from 0.1 to 2.5 μm.

The adhesion to the image area, scratch resistance and the like are also very important in view of handling of the lithographic printing plate precursor. More specifically, when a protective layer which is hydrophilic by containing a water-soluble polymer compound is stacked on the image recording layer which is lipophilic, the protective layer is readily separated due to insufficient adhesive strength and in the separated portion, defects such as curing failure ascribable to polymerization inhibition by oxygen may be caused.

In order to solve this problem, various proposals have been made with an attempt to improve the adhesive property between the image recording layer and the protective layer. For example, JP-A-49-70702 and Unexamined British Patent Publication No. 1,303,578 describe a technique of mixing from 20 to 60 mass % of an acrylic emulsion, a water-insoluble vinylpyrrolidone-vinyl acetate copolymer or the like in a hydrophilic polymer mainly comprising polyvinyl alcohol, and stacking the obtained solution on the image recording layer, thereby obtaining sufficiently high adhesive property. In the present invention, these known techniques all can be used. The method for coating the protective layer is described in detail, for example, in U.S. Pat. No. 3,458,311 and JP-B-55-49729.

Furthermore, other functions may be imparted to the protective layer. For example, when a colorant (for example, water-soluble dye) excellent in the transparency to infrared ray used for exposure and capable of efficiently absorbing light at other wavelengths is added, the aptitude for safelight can be enhanced without causing decrease in the sensitivity.

[Exposure]

In the lithographic printing method of the present invention, the above-described lithographic printing plate precursor of the present invention is imagewise exposed by an infrared laser.

The infrared laser for use in the present invention is not particularly limited, but suitable examples thereof include a solid or semiconductor laser of emitting an infrared ray at a wavelength of 760 to 1,200 nm. The output of the infrared laser is preferably 100 mW or more and in order to shorten the exposure time, a multi-beam laser device is preferably used.

The exposure time is preferably 20μ seconds or less per one picture element. The irradiation amount of energy is preferably from 10 to 300 mJ/cm$^2$.

[Printing]

In the lithographic printing method of the present invention, after the lithographic printing plate precursor of the present invention is imagewise exposed with an infrared laser as described above, printing is performed by supplying an oily ink and an aqueous component without passing through any development processing step.

Specific examples of the method therefor include a method of exposing the lithographic printing plate precursor with an infrared laser, then loading it on a printing press without passing through a development processing step, and performing printing, and a method of loading the lithographic printing plate precursor on a printing press, exposing it with an infrared laser on the printing press, and performing printing without passing through a development processing step.

For example, when the lithographic printing plate precursor is imagewise exposed with an infrared laser and then printing is performed by supplying an aqueous component and an oily ink without passing through a development processing step such as wet development, the image recording layer cured by the exposure forms an oily ink-receiving part with a lipophilic surface in the exposed part of the image recording layer. On the other hand, in the unexposed part, the uncured image recording layer is removed by dissolving or dispersing in the supplied aqueous component and/or oily ink, and the hydrophilic surface in this portion is revealed.

As a result, the aqueous component adheres to the revealed hydrophilic surface and the oily ink adheres to the image recording layer in the exposed region, thereby initiating the printing. Here, either the aqueous component or the oily ink may be first supplied to the plate surface, but the oily ink is preferably first supplied so as to prevent the aqueous component from being contaminated by the image recording layer in the unexposed part. A fountain solution and a printing ink for normal lithographic printing are used as the aqueous component and the oily ink, respectively.

In this way, the lithographic printing plate precursor is on-press developed on an off-set printing press and used as-is for printing a large number of sheets.

EXAMPLES

The present invention is described in greater detail below by referring to the Examples, but the present invention should not be construed as being limited thereto.

Examples 1 to 5

(1) Preparation of Support

A 0.3 mm-thick aluminum plate (construction material: 1050) was degreased with an aqueous 10 mass % sodium aluminate solution at 50° C. for 30 seconds to remove the rolling oil on the surface. Thereafter, the aluminum plate surface was grained by using three nylon brushes implanted with bundled bristles having a diameter of 0.3 mm and a water suspension (specific gravity: 1.1 g/cm$^3$) of pumice having a median diameter of 25 μm, and then thoroughly washed with water. This plate was etched by dipping it in an aqueous 25 mass % sodium hydroxide solution at 45° C. for 9 seconds and after washing with water, dipped in 20 mass % nitric acid at 60° C. for 20 seconds, followed by washing with water. At this time, the etched amount of the grained surface was about 3 g/m$^2$.

Subsequently, the aluminum plate was subjected to continuous electrochemical surface-roughening treatment by using an AC voltage at 60 Hz. The electrolytic solution used here was an aqueous 1 mass % nitric acid solution (containing 0.5 mass % of aluminum ion) at a liquid temperature of 50° C. This electrochemical surface-roughening treatment was performed by using an AC power source of giving a trapezoidal rectangular wave AC such that the time TP necessary for the current value to reach the peak from zero was 0.8 msec and the duty ratio was 1:1, and disposing a carbon electrode as the counter electrode. For the auxiliary anode, ferrite was used. The current density was 30 A/dm$^2$ in terms of the peak value of current, and 5% of the current flowing from the power source was split to the auxiliary anode. The quantity of electricity at the nitric acid electrolysis was 175 C/dm$^2$ when the aluminum plate was serving as the anode. Thereafter, the aluminum plate was water-washed by spraying.

Thereafter, the aluminum plate was subjected to electrochemical surface-roughening treatment in the same manner as in the nitric acid electrolysis above by using, as the electrolytic solution, an aqueous 0.5 mass % hydrochloric acid solution (containing 0.5 mass % of aluminum ion) at a liquid temperature of 50° C. under the conditions that the quantity of electricity was 50 C/dm$^2$ when the aluminum plate was serving as the anode, and then water-washed by spraying. This plate was treated in 15 mass % sulfuric acid (containing 0.5 mass % of aluminum ion) as the electrolytic solution at a current density of 15 A/dm$^2$ to provide a DC anodic oxide film of 2.5 g/m$^2$, and then subjected to pore-sealing treatment by dipping it in a solution heated to 75° C. containing 0.1 mass % sodium fluorozirconate and 1 mass % sodium dihydrogenphosphate and having a pH of 3.7, for 10 seconds. The aluminum plate was further treated in an aqueous 2.5 mass % sodium silicate solution at 30° C. for 10 seconds. The center line average roughness (Ra) of the obtained substrate was measured by using a needle having a diameter of 2 μm and found to be 0.51 μm.

Furthermore, Undercoat Solution (1) shown below was coated to have a dry coated amount of 6 mg/m$^2$, thereby preparing a support for use in the tests later.

Undercoat Solution (1):

| | |
|---|---|
| Undercoat Compound (1) | 0.017 g |
| Methanol | 9.00 g |
| Water | 1.00 g |

Undercoat Compound (1):

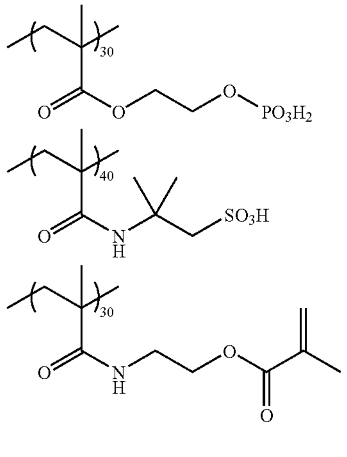

(2) Production of Dispersion-Stabilizing Resin

Production Example 1 of Dispersion-Stabilizing Resin: [P-1]

A mixed solution of 100 g of 2-ethylhexyl methacrylate, 150 g of toluene and 50 g of isopropanol was heated to 75° C. with stirring in a nitrogen stream and thereto, 2 g of 2,2'-azobis(4-cyanovaleric acid) (simply "A.C.V.") was added and reacted for 4 hours. Furthermore, 0.8 g of A.C.V. was added and reacted for 4 hours. After cooling, the reaction mixture was reprecipitated in 2 liter of methanol and the resulting oily matter was collected and dried.

A mixture of 50 g of the obtained oily matter, 6 g of 2-hydroxyethyl methacrylate and 150 g of tetrahydrofuran was dissolved and to the resulting solution, a mixed solution of 8 g of dicyclohexylcarbodiimide (D.C.C.), 0.2 g of 4-(N,N-dimethylamino)pyridine and 20 g of methylene chloride was added dropwise at 25 to 30° C. This solution was stirred as-is for 4 hours and to the resulting reaction mixture, 5 g of formic acid was added, followed by stirring for 1 hour. After separating the precipitated insoluble matter by filtration, the filtrate was reprecipitated in 1 liter of methanol and the resulting oily matter was collected. This oily matter was dissolved in 200 g of tetrahydrofuran and after separating the insoluble matter by filtration, the filtrate was again reprecipitated in 1 liter of methanol and the resulting oily matter was collected and dried. The yield was 32 g and the mass average molecular weight was $4.2\times10^4$.

P-1:

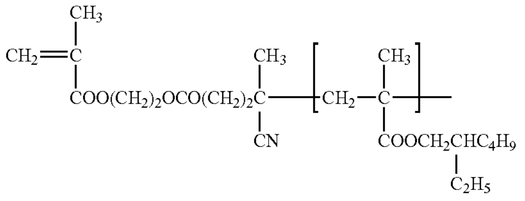

Production Example 2 of Dispersion-Stabilizing Resin: [P-2]

A mixed solution of 96 g of butyl methacrylate, 4 g of thioglycolic acid and 200 g of toluene was heated to 70° C. with stirring in a nitrogen stream and thereto, 1.0 g of AIBN was added and reacted for 8 hours. To this reaction solution, 8 g of glycidyl methacrylate, 1.0 g of N,N-dimethyldodecylamine and 0.5 g of tert-butylhydroquinone were added, and the resulting solution was stirred at a temperature of 100° C. for 12 hours. After cooling, the reaction solution was reprecipitated in 2 liter of methanol and 82 g of an oily matter was obtained. The mass average molecular weight was $8\times10^3$.

(3) Production of Crosslinked Resin Particle

Production Example 1 of Resin Particle: [L-1]

A mixed solution of 7.5 g of a dispersion-stabilizing resin AA-6 [a macromonomer produced by Toagosei Co., Ltd., which is a macromonomer comprising methyl methacrylate as the repeating unit; mass average molecular weight: $1.5\times10^4$] and 133 g of methyl ethyl ketone was heated to 60° C. with stirring in a nitrogen stream. To the resulting solution, a mixed solution of 20 g of methyl methacrylate, 5 g of 2-hydroxyethyl methacrylate, 5 g of diethylene glycol dimethacrylate, 0.5 g of azobisisovaleronitrile (AIVN) and 150 g of methyl ethyl ketone was added dropwise over 1 hour and furthermore, 0.25 g of AIVN was added and reacted for 2 hours. After cooling, the reaction solution was passed through a 200-mesh nylon cloth. The average particle diameter of the obtained dispersion was 0.25 μm. The solid content concentration was adjusted to 15 mass % by adding methyl ethyl ketone.

Production Example 2 of Resin Particle: [L-2]

In Production Example 1 of Resin particle, Dispersion-Stabilizing Resin P-1 was used in place of Dispersion-Stabilizing Resin AA-6. The average particle diameter was 0.22 μm.

Production Example 3 of Resin Particle: [L-3]

In Production Example 1 of Resin particle, Dispersion-Stabilizing Resin P-2 was used in place of Dispersion-Stabilizing Resin AA-6. The average particle diameter was 0.23 μm.

Production Example 4 of Resin Particle: [L-4]

In Production Example 1 of Resin particle, glycidyl methacrylate was used in place of 2-hydroxyethyl methacrylate. The average particle diameter was 0.21 μm.

Production Example 5 of Resin Particle: [L-5]

To the liquid dispersion of Resin Particle L-1 obtained in Production Example 1 of Resin particle, 5 g of methacryl chloride and 3 g of triethylamine were sequentially added and reacted at 50° C. with stirring for 1 hour. After cooling, the reaction solution was passed through a 200-mesh nylon cloth. The average particle diameter of the obtained dispersion was 0.26 μm. This dispersion was precipitated by a centrifugal separator and after removing the supernatant, methyl ethyl ketone was added thereto and the precipitate was redispersed at a solid content concentration of 15 mass %. At this time, the average particle diameter was 0.25 μm.

Production Example 6 of Resin Particle

Comparative Example where the Resin Particle has No Reactive Group: [L-6]

A mixed solution of 7.5 g of a dispersion-stabilizing resin AA-6 [a macromonomer produced by Toagosei Co., Ltd., which is a macromonomer comprising methyl methacrylate as the repeating unit; mass average molecular weight: $1.5\times10^4$] and 133 g of methyl ethyl ketone was heated to 60° C. with stirring in a nitrogen stream. To the resulting solution, a mixed solution of 25 g of methyl methacrylate, 5 g of diethylene glycol dimethacrylate, 0.5 g of AIVN and 150 g of methyl ethyl ketone was added dropwise over 1 hour and furthermore, 0.25 g of AIVN was added and reacted for 2 hours. After cooling, the reaction solution was passed through a 200-mesh nylon cloth. The average particle diameter of the obtained dispersion was 0.25 μm. The solid content concentration was adjusted to 15 mass % by adding methyl ethyl ketone.

Production Example 7 of Resin Particle: [L-7]

As the oil phase component, 14 g of trimethylolpropane and xylene diisocyanate adduct (Takenate D-110N, produced by Mitsui Takeda Chemicals, Inc., a 75 mass % ethyl acetate solution), 2.0 g of Ethylenic Double Bond-Containing Compound (A) and 0.12 g of Pionin A-41C (produced by Takemoto Yushi Co., Ltd.) were dissolved in 16.67 g of ethyl acetate. As the aqueous phase component, 37.5 g of an aqueous 4 mass % PVA-205 solution was prepared. The oil phase component and the aqueous phase component were mixed and emulsified in a homogenizer at 12,000 rpm for 10 minutes. The resulting emulsified product was added to 25 g of distilled water and the obtained mixture was stirred at room temperature for 30 minutes and then stirred at 40° C. for 2 hours. The thus-obtained microcapsule solution was diluted with distilled water to a solid content concentration of 15 mass %. The average particle diameter was 0.2 μm.

Ethylenic Double Bond-Containing Compound (A):

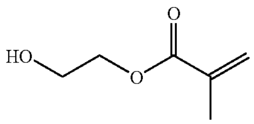

Production Example 8 of Resin Particle: [L-8]

As the oil phase component, 10 g of trimethylolpropane and xylene diisocyanate adduct (Takenate D-110N, produced by Mitsui Takeda Chemicals, Inc., a 75 mass % ethyl acetate solution), 3.00 g of Aronics M-215 (produced by Toagosei Co., Ltd.) and 0.12 g of Pionin A-41C (produced by Takemoto Yushi Co., Ltd.) were dissolved in 16.67 g of ethyl acetate. As the aqueous phase component, 37.5 g of an aqueous 4 mass % PVA-205 solution was prepared. The oil phase component and the aqueous phase component were mixed and emulsified in a homogenizer at 12,000 rpm for 10 minutes. The resulting emulsified product was added to 25 g of distilled water and the obtained mixture was stirred at room temperature for 30 minutes and then stirred at 40° C. for 2 hours. The thus-obtained microcapsule solution was diluted with distilled water to a solid content concentration of 15 mass %. The average particle diameter was 0.2 μm. The cross section of the particle was observed by SEM, as a result, it was confirmed that Aronics M-215 having an ethylenically unsaturated bond was not enclosed in the particle unlike a microcapsule but was present on the surface.

Production Example 9 of Resin Particle

Comparative Example where the Resin Particle has No Reactive Group: [L-9]

As the oil phase component, 10 g of trimethylolpropane and xylene diisocyanate adduct (Takenate D-110N, produced by Mitsui Takeda Chemicals, Inc., a 75 mass % ethyl acetate solution) and 0.12 g of Pionin A-41C (produced by Takemoto Yushi Co., Ltd.) were dissolved in 16.67 g of ethyl acetate. As the aqueous phase component, 37.5 g of an aqueous 4 mass % PVA-205 solution was prepared. The oil phase component and the aqueous phase component were mixed and emulsified in a homogenizer at 12,000 rpm for 10 minutes. The resulting emulsified product was added to 25 g of distilled water and the obtained mixture was stirred at room temperature for 30 minutes and then stirred at 40° C. for 2 hours. The thus-obtained microcapsule solution was diluted with distilled water to a solid content concentration of 15 mass %. The average particle diameter was 0.2 μm.

(4) Production of Lithographic Printing Plate Precursor

A coating solution for the image recording layer having the following composition (Photosensitive Solution 1) was bar-coated on the support prepared above, and dried in an oven at 100° C. for 60 seconds to form an image recording layer having a dry coated amount of 1.0 g/$m^2$. In this way, lithographic printing plate precursors of Examples 1 to 5 were obtained.

Photosensitive Solution 1:

| | |
|---|---|
| Binder Polymer (1) | 0.162 g |
| Polymerization Initiator (1) | 0.100 g |
| Infrared Absorbent (1) | 0.020 g |
| Polymerizable monomer, Aronics M-215 (produced by Toagosei Co., Ltd.) | 0.385 g |
| Fluorine-Containing Surfactant (1) | 0.044 g |
| Resin Particle L-1, L-2, L-3, L-4 or L-5 | 2.640 g |
| Methyl ethyl ketone (MEK) | 1.091 g |
| 1-Methoxy-2-propanol (MFG) | 8.609 g |

Comparative Example 1

A lithographic printing plate precursor of Comparative Example 1 was obtained by using Photosensitive Solution 2 in the same manner as in Examples 1 to 5.

Photosensitive Solution 2:

| | |
|---|---|
| Binder Polymer (2) | 0.162 g |
| Polymerization Initiator (1) | 0.100 g |
| Infrared Absorbent (1) | 0.020 g |
| Polymerizable monomer, Aronics M-215 (produced by Toagosei Co., Ltd.) | 0.385 g |
| Fluorine-Containing Surfactant (1) | 0.044 g |
| Resin Particle L-6 | 2.640 g |
| MEK | 1.091 g |
| MFG | 8.609 g |

Comparative Example 2

A lithographic printing plate precursor of Comparative Example 2 was obtained by using Photosensitive Solution 3 in the same manner as in Examples 1 to 5.

Photosensitive Solution 3:

| | |
|---|---|
| Binder Polymer (2) | 0.162 g |
| Polymerization Initiator (1) | 0.100 g |
| Infrared Absorbent (1) | 0.020 g |
| Polymerizable monomer, Aronics M-215 (produced by Toagosei Co., Ltd.) | 0.385 g |
| Fluorine-Containing Surfactant (1) | 0.044 g |
| MEK | 1.091 g |
| MFG | 8.609 g |

Examples 6 and 7

Photosensitive Solution 4 having the following composition was bar-coated on the support prepared above, and dried in an oven at 100° C. for 60 seconds to form an image recording layer having a dry coated amount of 1.0 g/$m^2$. In this way, lithographic printing plate precursors of Examples 6 and 7 were obtained.

Photosensitive Solution 4 (the organic solvent composition and the water solvent composition were mixed immediately before coating):

Organic Solvent Composition:

| | |
|---|---|
| Binder Polymer (2) | 0.162 g |
| Polymerization Initiator (1) | 0.100 g |
| Infrared Absorbent (1) | 0.020 g |
| Polymerizable monomer, Aronics M-215 (produced by Toagosei Co., Ltd.) | 0.385 g |
| Fluorine-Containing Surfactant (1) | 0.044 g |
| MEK | 1.091 g |
| MFG | 8.609 g |

Water Solvent Composition:

| | |
|---|---|
| Resin Particle L-7 or L-8 | 2.640 g |
| Water | 2.425 g |

Comparative Example 3

A lithographic printing plate precursor of Comparative Example 3 was obtained by using Photosensitive Solution 5 in the same manner as in Examples 6 and 7.

Photosensitive Solution 5 (the organic solvent composition and the water solvent composition were mixed immediately before coating):

Organic Solvent Composition:

| | |
|---|---|
| Binder Polymer (2) | 0.162 g |
| Polymerization Initiator (1) | 0.100 g |
| Infrared Absorbent (1) | 0.020 g |
| Polymerizable monomer, Aronics M-215 (produced by Toagosei Co., Ltd.) | 0.385 g |
| Fluorine-Containing Surfactant (1) | 0.044 g |
| MEK | 1.091 g |
| MFG | 8.609 g |

Water Solvent Composition:

| | |
|---|---|
| Resin Particle L-7 | 2.640 g |
| Water | 2.425 g |

Polymerization Initiator (1):

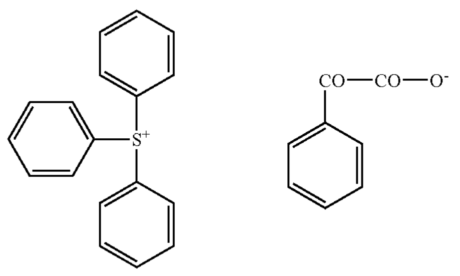

Infrared Absorbent (1):

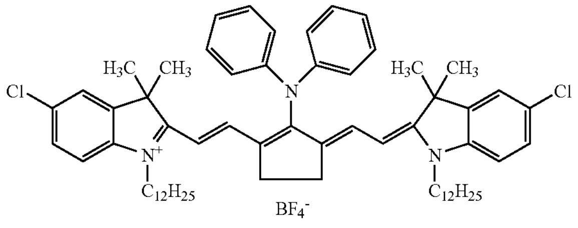

Fluorine-Containing Surfactant (1):

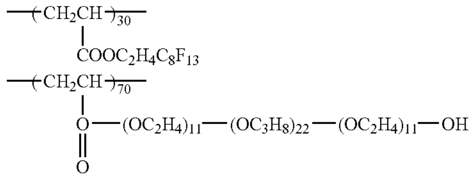

Binder Polymer (1):

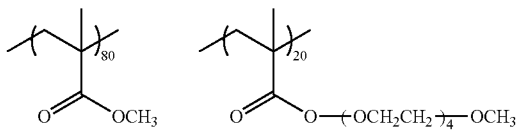

Binder Polymer (2):

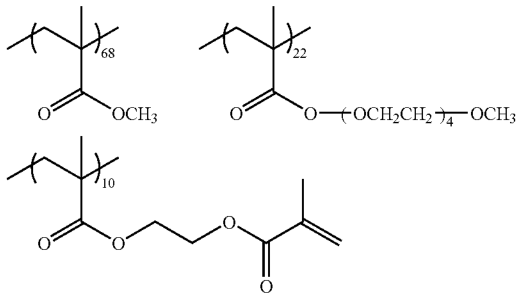

[Exposure, Printing and Evaluation of Lithographic Printing Plate Precursors of Examples 1 to 7 and Comparative Examples 1 to 3]

The lithographic printing plate precursors obtained above each was exposed by using Trendsetter 3244VX (manufactured by Creo) having mounted thereon a water-cooling 40 W infrared semiconductor laser, under the conditions that the output was 9 W, the rotation number of outer drum was 210 rpm and the resolution was 2,400 dpi. The exposure image was prepared to contain a fine line chart. The exposed lithographic printing plate precursor was, without passing through development processing, loaded on a cylinder of a printing press, SOR-M, manufactured by Heidelberg and after supplying an ink and a fountain by using the fountain solution (EU-3 (etching solution, produced by Fuji Photo Film Co., Ltd.)/water/isopropyl alcohol=1/89/10 (by volume)) and TRANS-G(N) Black Ink (produced by Dai-Nippon Ink & Chemicals, Inc.), 100 sheets were printed at a printing speed of 6,000 sheets per hour.

The number of printing sheets required until the on-press development of the image recording layer in the unexposed part was completed on the printing press and occurrence of the ink transfer to the printing sheet did not occur was counted and evaluated as the on-press developability.

Generally, in the case of a negative-working lithographic printing plate precursor, when the exposure amount is small, the cure degree of the image recording layer becomes low, whereas when the exposure amount is large the cure degree becomes high. If the cure degree of the image recording layer is too low, the lithographic printing plate is reduced in the press life and suffers from defective reproducibility of a dot or a fine line. On the other hand, when the cure degree of the image recording layer is high, a long press life and good reproducibility of a dot or a fine line are obtained.

In these Examples, as described below, the press life and fine line reproducibility of each of the lithographic printing plate precursors obtained were evaluated under the same exposure conditions described above, and these were evaluated as an index for the sensitivity of lithographic printing plate precursor. That is, as the number of printing sheets in the evaluation of the press life is larger or as the width of a fine line in the evaluation of the fine line reproducibility is smaller, the sensitivity of the lithographic printing plate precursor can be judged high.

(1) Fine Line Reproducibility

After printing 100 sheets as above and confirming that a printed matter free from ink staining in the non-image area was obtained, 500 sheets were subsequently printed. Of these 600 printed matters in total, the fine line chart (a chart created by exposing fine lines of 10, 12, 14, 16, 18, 20, 25, 30, 35, 40, 60, 80, 100 and 200 μm) on the 600th printed matter was observed by a 25-power magnifier, and the fine line reproducibility was evaluated by the fine line width reproduced by the ink without interruption. The level capable of reproducing a line width as fine as 10 μm was rated ○, and the level capable of reproducing a line width as fine as 16 μm was rated Δ. The results obtained are shown in Table 1.

(2) Press Life

After performing printing in the evaluation of fine line reproducibility above, printing was further continued. As the number of printing sheets increased, the image recording layer was gradually abraded and the ink receptivity and in turn, the ink density on the printing sheet were decreased. The press life was evaluated by the number of printing sheets used until the ink density (reflection density) decreased by 0.1 from the initiation of printing. The results obtained are shown in Table 1.

TABLE 1

| Example | Resin Particle | On-Press Developability | Fine Line Reproducibility (mJ/cm$^2$) 50 | 70 | 100 | 150 | Press Life |
|---|---|---|---|---|---|---|---|
| 1 | L-1 | 17 sheets | Δ | ○ | ○ | ○ | 42,000 sheets |
| 2 | L-2 | 15 sheets | Δ | ○ | ○ | ○ | 47,000 sheets |
| 3 | L-3 | 16 sheets | Δ | ○ | ○ | ○ | 41,000 sheets |
| 4 | L-4 | 16 sheets | ○ | ○ | ○ | ○ | 42,000 sheets |
| 5 | L-5 | 15 sheets | ○ | ○ | ○ | ○ | 42,000 sheets |
| 6 | L-7 | 15 sheets | ○ | ○ | ○ | ○ | 51,000 sheets |
| 7 | L-8 | 15 sheets | ○ | ○ | ○ | ○ | 52,000 sheets |
| Comparative Example 1 | L-6 | 17 sheets | X | Δ | ○ | ○ | 15,000 sheets |

TABLE 1-continued

| Example | Resin Particle | On-Press Developability | Fine Line Reproducibility (mJ/cm$^2$) 50 | 70 | 100 | 150 | Press Life |
|---|---|---|---|---|---|---|---|
| Comparative Example 2 | None | 60 sheets | Δ | ○ | ○ | ○ | 60,000 sheets |
| Comparative Example 3 | L-9 | 16 sheets | X | Δ | ○ | ○ | 12,000 sheets |

As apparent from Table 1, according to the lithographic printing method of the present invention using the lithographic printing plate precursor of the present invention (Examples 1 to 7), the fine line reproducibility and the press life were remarkably enhanced as compared with the case using a conventional lithographic printing plate precursor (Comparative Examples 1 to 3). Also, when the particle was not used, the on-press developability was poor.

Examples 8 to 10 and Comparative Examples 4 and 5

(1) Preparation of Support

After an anodic oxide film was provided and then subjected to water washing and drying in the same manner as in the preparation of support used in Examples 1 to 7, an undercoat layer was provided in the same manner as in the support used in Examples 1 to 7 except for using Undercoat Compound (2) shown below in place of Undercoat Compound (1). In this way, a support for use in tests layer was prepared.

Undercoat Compound (2):

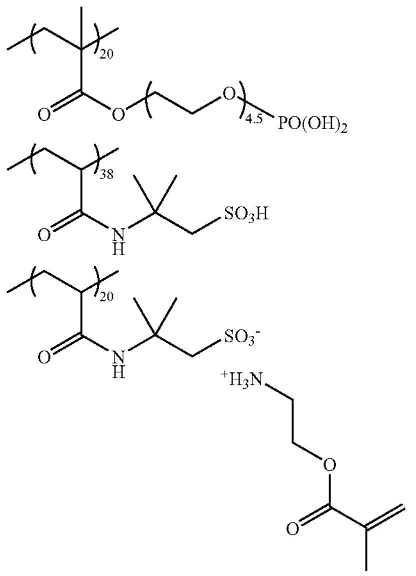

-continued

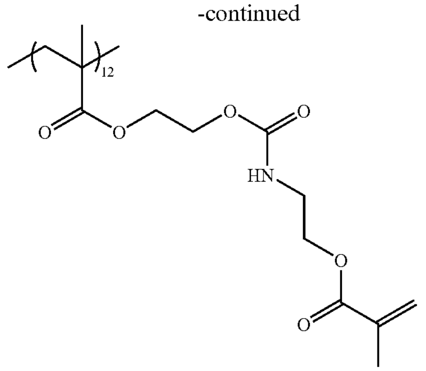

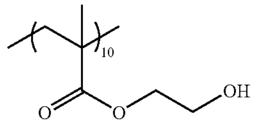

(2) Synthesis of Microcapsule

Synthesis Example 1

Microcapsule (1)

As the oil phase component, 10.0 g of trimethylolpropane and xylene diisocyanate adduct (Takenate D-110N, produced by Mitsui Takeda Chemicals, Inc., a 75 mass % ethyl acetate solution), 6.00 g of Light Acrylate DPE-6A (dipentaerythritol hexaacrylate, produced by Kyoeisha Chemical Co., Ltd.) as the polymerizable monomer, and 0.54 g of Pionin A-41C (produced by Takemoto Yushi Co., Ltd.) were dissolved in 16.61 g of ethyl acetate. As the aqueous phase component, 37.5 g of an aqueous 4 mass % PVA-205 (produced by Kuraray Co., Ltd.) solution was weighed. The oil phase component and the aqueous phase component were mixed and emulsified in a homogenizer at 12,000 rpm for 10 minutes. The resulting emulsified product was added to 24.48 g of distilled water and the obtained mixture was stirred at room temperature for 30 minutes and then stirred at 40° C. for 2 hours. The thus-obtained microcapsule solution was diluted with distilled water to a solid content concentration of 15 mass %. The particle diameter of the microcapsule obtained was measured by a particle diameter distribution measuring apparatus "LA-910", manufactured by Horiba Ltd., and found to be 0.19 μm in terms of the median diameter. Furthermore, the glass transition temperature (Tg) of the microcapsule wall was measured as described above and found to be 95° C.

Synthetic Example 2

Microcapsule (2)

A 15 mass % aqueous solution of Microcapsule (2) was obtained in the same manner as in Synthesis Example 1 except for changing Light Acrylate DPE-6A used in Synthesis Example 1 to SR399E (dipentaerythritol pentaacrylate, produced by Nippon Kayaku Co., Ltd.). The particle diameter of the obtained microcapsule was 0.18 μm, and the glass transition temperature (Tg) of the microcapsule wall was 90° C.

Synthetic Example 3

Microcapsule (3)

A 15 mass % aqueous solution of Microcapsule (3) was obtained in the same manner as in Synthesis Example 1 except for changing Light Acrylate DPE-6A used in Synthesis Example 1 to Aronics M-219 (isocyanuric acid EO-modified diacrylate, produced by Toagosei Co., Ltd.). The particle diameter of the obtained microcapsule was 0.18 μm, and the glass transition temperature (Tg) of the microcapsule wall was 85° C.

Synthetic Example 4

Microcapsule (4)

A 15 mass % aqueous solution of Microcapsule (4) was obtained in the same manner as in Synthesis Example 1 except for newly adding 0.6 g of tetraethylenepentamine to the distilled water added after emulsification in Synthesis Example 1. The particle diameter of the obtained microcapsule was 0.20 μm, and the glass transition temperature (Tg) of the microcapsule wall was 120° C.

Synthetic Example 5

Microcapsule (5)

A 15 mass % aqueous solution of Microcapsule (5) was obtained in the same manner as in Synthesis Example 1 except for not adding Pionin A-41C used in Synthesis Example 1. The particle diameter of the obtained microcapsule was 0.26 μm, and the glass transition temperature (Tg) of the microcapsule wall was 110° C.

(3) Preparation of Coating Solution for Image Recording Layer

Coating Solution (1) for Image Recording Layer:

An organic solvent composition solution and a water solvent composition solution were prepared according to the following formulations. Subsequently, the water solvent solution was added to the organic solvent solution with stirring, and 15 minutes after the addition, the stirring was stopped to complete Coating Solution (1) for Image Recording Layer.

Organic Solvent Composition:

| | |
|---|---|
| Infrared Absorbent (1) | 0.2 g |
| Polymerization Initiator (1) | 1.0 g |
| Binder Polymer (1) (average molecular weight: 80,000) | 1.6 g |
| Polymerizable monomer (Aronics M-215 (produced by Toagosei Co., Ltd.) | 3.9 g |
| Propylene glycol monomethyl ether | 86.1 g |
| MEK | 11.0 g |

Water Solvent Composition:

| | |
|---|---|
| Microcapsule (1) | 26.5 g |
| Distilled water | 47.1 g |
| Fluorine-containing surfactant | 0.05 g |

Coating Solution (2) for Image Recording Layer:

Coating Solution (2) for Image Recording Layer was obtained in the same manner as in the preparation of Coating Solution (1) for Image Recording Layer except for changing Microcapsule (1) used in Coating Solution (1) for Image Recording Layer to Microcapsule (2).

Coating Solution (3) for Image Recording Layer:

Coating Solution (3) for Image Recording Layer was obtained in the same manner as in the preparation of Coating Solution (1) for Image Recording Layer except for changing Microcapsule (1) used in Coating Solution (1) for Image Recording Layer to Microcapsule (3).

Comparative Coating Solution (4) for Image Recording Layer:

Comparative Coating Solution (4) for Image Recording Layer was obtained in the same manner as in the preparation of Coating Solution (1) for Image Recording Layer except for changing Microcapsule (1) used in Coating Solution (1) for Image Recording Layer to Microcapsule (4).

Comparative Coating Solution (5) for Image Recording Layer:

Comparative Coating Solution (5) for Image Recording Layer was obtained in the same manner as in the preparation of Coating Solution (1) for Image Recording Layer except for changing Microcapsule (1) used in Coating Solution (1) for Image Recording Layer to Microcapsule (5).

(4) Production of Lithographic Printing Plate Precursor

One hour after, 12 hours after or 3 days after the preparation of the coating solution for image recording layer, each coating solution was bar-coated on the support prepared above and then dried in an oven at 120° C. for 40 seconds to form an image recording layer having a dry coated amount of 1.0 g/$m^2$, thereby obtaining a lithographic printing plate precursor.

(5) Exposure and Printing

The obtained lithographic printing plate precursor was subjected to exposure and printing under the same conditions as in Example 1 except that the printing was performed at a speed of 8,000 sheets per hour by using a printing press, SPRINT 25, manufactured by Komori Corp. With any lithographic printing plate precursor, good on-press developability was exhibited and a printed matter free from staining was obtained. The press life was evaluated in the same manner as in Example 1 and the results obtained are shown in Table 2.

TABLE 2

| | Number of Coating Solution for Image Recording Layer | Tg of Microcapsule Wall | Press Life |
|---|---|---|---|
| Example 8 | (1) | 95° C. | 19,000 sheets |
| Example 9 | (2) | 90° C. | 20,000 sheets |
| Example 10 | (3) | 85° C. | 22,000 sheets |
| Comparative Example 4 | (4) | 120° C. | 14,000 sheets |
| Comparative Example 5 | (5) | 110° C. | 13,000 sheets |

The results above reveal that the lithographic printing plate precursor of the present invention exhibits good press life.

The presence of the polymerizable monomer in the capsule wall was confirmed by the following method.

In a mixed solvent having the same composition (60 mass % of propylene glycol monomethyl ether, 8 mass % of methyl ethyl ketone and 32 mass % of water) as the coating solvent, the microcapsule was dispersed to give a concentration of 10 mass % and then stirred for 30 minutes. The resulting dispersion was centrifuged at a rotation number of 16,500 rpm for 90 minutes to separate the microcapsule as the residue. After removing the supernatant, the residue comprising the microcapsule was lightly washed with the mixed solvent and dispersed in water, and the dispersion was coated and dried on an aluminum substrate to have a dry mass of 1 g/$m^2$. The obtained sample was subjected to the measurement of Cls spectrum by an X-ray photoelectron analyzer and whether the peak originated in the carbonyl carbon was present at 288 eV was confirmed. As a result, the peak was detected in Examples 8 to 10 but not detected in Comparative Examples 4 and 5.

This application is based on Japanese patent application JP 2004-377130, filed on Dec. 27, 2004, the entire content of which is hereby incorporated by reference, the same as if set forth at length.

What is claimed is:

1. A lithographic printing plate precursor capable of performing a development and printing by loading on a printing press after imagewise exposure and supplying an oily ink and an aqueous component, the lithographic printing plate precursor comprising a support and an image recording layer, wherein the image recording layer comprises (A) a polymerization initiator, (B) a polymerizable monomer, (C) a binder polymer, which is an acrylic resin having a polyoxyethyl group, (D) a crosslinked resin particle having a reactive group, and (E) an infrared absorbent, and is polymerization-curable upon irradiation of actinic rays from an infrared laser, wherein the binder polymer of component (C) has an ethylenically unsaturated bond, and wherein said lithographic printing plate precursor further comprises an undercoat layer provided between the image recording layer and the support, wherein the undercoat layer comprises a polymer having an ethylenically unsaturated bond in a side chain thereof which is obtained by copolymerizing a monomer having a group adsorptive to the substrate, a monomer having a hydrophilic group and a monomer having an ethylenically unsaturated bond in the side chain thereof.

2. The lithographic printing plate precursor as claimed in claim 1, wherein the reactive group of said crosslinked resin particle (D) is at least one group selected from an ethylenically unsaturated group, an epoxy group, a hydroxyl group and an amino group.

3. A lithographic printing method comprising:

imagewise exposing the lithographic printing plate precursor described in claim 1 by irradiation of actinic ray, wherein the image recording layer is imagewise polymerization-cured upon the irradiation of actinic ray; and performing a development and printing by loading the exposed lithographic printing plate precursor on a printing press and supplying an oily ink and an aqueous component.

4. The lithographic printing plate precursor as claimed in claim 1, wherein the crosslinked resin particle of component (D) is polyurethane or polyurea.

5. The lithographic printing plate precursor as claimed in claim 1, wherein the reactive group of the crosslinked resin particle of component (D) is a functional group having an ethylenically unsaturated bond.

6. The lithographic printing plate precursor as claimed in claim 1, wherein the average particle diameter of the crosslinked resin particle of component (D) is from 0.05 to 2.0 μm.

7. The lithographic printing plate precursor as claimed in claim 1, wherein the average particle diameter of the crosslinked resin particle of component (D) is from 0.10 to 1.0 μm.

* * * * *

UNITED STATES PATENT AND TRADEMARK OFFICE

CERTIFICATE OF CORRECTION

PATENT NO. : 7,790,352 B2
APPLICATION NO. : 12/073429
DATED : September 7, 2010
INVENTOR(S) : Akio Oda et al.

It is certified that error appears in the above-identified patent and that said Letters Patent is hereby corrected as shown below:

ON THE TITLE PAGE:

Under item (12), change Oda to -- Oda et al. --.

ON THE TITLE PAGE:

At item (75), Inventor, change:

"Akio Oda, Shizuoka (JP)"

to

-- Akio Oda, Shizuoka (JP); Norio Aoshima, Shizuoka (JP) --.

Signed and Sealed this
Fourth Day of January, 2011

David J. Kappos
*Director of the United States Patent and Trademark Office*